(12) United States Patent
Kinoshita et al.

(10) Patent No.: US 7,924,138 B2
(45) Date of Patent: Apr. 12, 2011

(54) SEMICONDUCTOR DEVICE AND MANUFACTURING METHOD OF THE SAME

(75) Inventors: Kentaro Kinoshita, Tottori (JP); Chikako Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/546,089

(22) Filed: Aug. 24, 2009

(65) Prior Publication Data

US 2009/0309690 A1 Dec. 17, 2009

Related U.S. Application Data

(63) Continuation of application No. PCT/JP2007/053884, filed on Mar. 1, 2007.

(51) Int. Cl.
*H01C 7/10* (2006.01)
(52) U.S. Cl. ............ 338/20; 365/148; 357/314
(58) Field of Classification Search .......... 338/20; 365/148, 149; 357/314
See application file for complete search history.

(56) References Cited

U.S. PATENT DOCUMENTS

| | | | |
|---|---|---|---|
| 6,664,117 B2 | 12/2003 | Zhuang et al. | |
| 6,673,691 B2 | 1/2004 | Zhuang et al. | |
| 6,759,249 B2 | 7/2004 | Zhuang et al. | |
| 7,242,469 B2 | 7/2007 | Wang et al. | |
| 7,384,792 B1 | 6/2008 | Wang et al. | |
| 7,400,027 B2 | 7/2008 | Joung et al. | |
| 7,420,198 B2 | 9/2008 | Baek et al. | |
| 7,428,046 B2 | 9/2008 | Wang et al. | |
| 7,460,224 B2 | 12/2008 | Wang et al. | |
| 7,668,002 B2 | 2/2010 | Kinoshita et al. | |
| 7,741,669 B2 | 6/2010 | Baek et al. | |
| 2003/0148545 A1 | 8/2003 | Zhuang et al. | |
| 2003/0148546 A1 | 8/2003 | Zhuang et al. | |
| 2003/0156445 A1 | 8/2003 | Zhuang et al. | |
| 2004/0026730 A1* | 2/2004 | Kostylev et al. | 257/314 |
| 2004/0245557 A1 | 12/2004 | Seo et al. | |
| 2005/0206892 A1 | 9/2005 | Wang et al. | |
| 2006/0054950 A1 | 3/2006 | Baek et al. | |
| 2006/0131554 A1 | 6/2006 | Joung et al. | |
| 2007/0114587 A1 | 5/2007 | Seo et al. | |
| 2007/0140900 A1 | 6/2007 | Wang et al. | |
| 2007/0153267 A1 | 7/2007 | Wang et al. | |
| 2007/0153269 A1 | 7/2007 | Wang et al. | |

(Continued)

FOREIGN PATENT DOCUMENTS

JP 2004-241396 A 8/2004

(Continued)

OTHER PUBLICATIONS

I. G. Baek et al. "Highly Scalable Non-volatile Resistive Memory using Simple Binary Oxide Driven by Asymmetric Unipolar Voltage Pulses," Technical Digest IEDM 2004, pp. 587-590.

A. Beck et al. "Reproducible switching effect in thin oxide films for memory applications," Applied Physics Lettters, Jul. 3, 2000, vol. 77, No. 1, pp. 139-141.

(Continued)

*Primary Examiner* — Kyung Lee
(74) *Attorney, Agent, or Firm* — Fujitsu Patent Center

(57) ABSTRACT

A titanium oxide film, a nickel oxide film and a top electrode are formed on a bottom electrode, and a resistance element is constituted by the bottom electrode, the titanium oxide film, the nickel oxide film and the top electrode. A thickness of the titanium oxide film is 5 nm, and a thickness of the nickel oxide film is 60 nm. A rate of oxygen in nickel oxide composing the nickel oxide film is lower than a rate of oxygen in a stoichiometric composition.

17 Claims, 18 Drawing Sheets

U.S. PATENT DOCUMENTS

| | | |
|---|---|---|
| 2007/0229817 A1 | 10/2007 | Wang et al. |
| 2008/0117664 A1 | 5/2008 | Kinoshita et al. |
| 2009/0008620 A1 | 1/2009 | Baek et al. |
| 2009/0046284 A1 | 2/2009 | Wang et al. |
| 2009/0066946 A1 | 3/2009 | Wang et al. |
| 2009/0086202 A1 | 4/2009 | Wang et al. |
| 2010/0224850 A1 | 9/2010 | Baek et al. |

FOREIGN PATENT DOCUMENTS

| | | |
|---|---|---|
| JP | 2004-363604 A | 12/2004 |
| JP | 2006-179926 A | 7/2006 |
| KR | 2006-0023860 A | 3/2006 |
| WO | 2007/013174 A1 | 2/2007 |

OTHER PUBLICATIONS

International Search Report of PCT/JP2007/053884, Mailing Date of May 29, 2007.

Notification of Transmittal of Translation of the International Preliminary Report on Patentability (Form PCT/IB338) of International Application No. PCT/JP2007/053884 with Forms PCT/IB/373 and PCT/ISA/237.

Korean Notice of Preliminary Rejection, English-language translation, mailed Jan. 14, 2011 for corresponding Korean Application No. 10-2009-7017093.

* cited by examiner

SEMICONDUCTOR DEVICE AND MANUFACTURING METHOD OF THE SAME

CROSS-REFERENCE TO RELATED APPLICATIONS

This application is a Continuation of International Application No. PCT/JP2007/053884, with an international filing date of Mar. 1, 2007, which designating the United States of America, the entire contents of which are incorporated herein by reference.

FIELD

The embodiments discussed herein relate to a semiconductor device and a manufacturing method thereof suitable for a nonvolatile memory storing information in accordance with a change of an electric resistance of a resistance element.

BACKGROUND

In recent years, a nonvolatile memory cell storing data by using substances in which a resistance value changes in accordance with external electrical stimulation is manufactured. A memory including the nonvolatile memory cell as stated above is called as a resistance change memory. The substances as stated above can be largely categorized into two types in accordance with electrical characteristics thereof. One may be called as bipolar materials, and the other may be called as unipolar materials.

As the bipolar materials, $SrTiO_3$ and $SrZrO_3$ in which an impurity such as Cr is doped slightly can be cited. $Pr_{(1-x)}Ca_xMnO_3$, $La_{(1-x)}Ca_xMnO_3$, and so on representing a colossal magnetoresistance (CMR) are also the bipolar materials. When a voltage having a threshold value or more is applied to a thin film composed of the bipolar material or a bulk material, a change of a resistance occurs. The resistance is kept stable before and after the change. When the voltage having the other threshold value or more with a reversed polarity is applied after the change of the resistance occurs, the resistance of the bipolar material returns to the same level as an original resistance. As stated above, it is necessary to apply the voltages having the polarities different from one another for the change of the resistance, in the bipolar material.

In Non-Patent Document 1, the change of the resistance of $SrZrO_3$ into which Cr of 0.2% is doped is described. When a negative voltage is applied, an absolute value of a current increases rapidly in a vicinity of −0.5 V. Namely, the resistance of $SrZrO_3$ changes rapidly from high-resistance to low-resistance. A switching phenomenon from high-resistance to low-resistance as stated above and a process thereof are sometimes called as a "set". Next, when the voltage is applied in a positive direction so as to be swept, the value of the current decreases rapidly in a vicinity of +0.5 V. Namely, the resistance of $SrZrO_3$ returns rapidly from low-resistance to high-resistance. A switching phenomenon from low-resistance to high-resistance as stated above and a process thereof are sometimes called as a "reset". Besides, the respective resistances are stable within a range of ±0.5 V, and they are kept even though the voltage is not applied. Accordingly, it becomes possible to use the bipolar material to a memory by corresponding the high-resistance state and the low-resistance state to "0" (zero) and "1" respectively. Incidentally, a threshold voltage by which the resistance changes depends on a material, a crystallinity, and so on. Besides, it is also possible to change the resistance by applying a pulse voltage aside from a direct-current voltage.

As the unipolar material, an oxide of a transition metal (TMO: Transition Metal Oxide) such as $NiO_x$ and $TiO_x$ can be cited. In the unipolar material, the change of the resistance occurs independently from the polarity of the applied voltage, and an absolute value of the voltage by which the change from low-resistance to high-resistance (reset) occurs is smaller than an absolute value of the voltage by which the change from high-resistance to low-resistance occurs (set). Besides, the resistance is kept stable before and after the change as same as the bipolar material. Besides, the change of the resistance is reversible. Accordingly, it is possible to switch a value of the resistance without changing the polarity of the voltage. As stated above, it is necessary to apply the voltages mutually having one polarity for the change of the resistance, in the unipolar material. Characteristics of the unipolar material as stated above are described in Non-Patent Document 2. Incidentally, when the pulse voltage is applied, a behavior as stated above can be seen if a pulse width is fixed.

FIG. 12 is a graphic chart illustrating a current-voltage characteristic of a thin film of $TiO_x$ being the unipolar material. When a voltage is applied to a high-resistance state thin film (1), the resistance decreases rapidly at a certain voltage (approximately at 1.5 V) and a current increases rapidly (2). After that, when the voltage is lowered while setting a current limit (a limit value: 20 mA) (3), the current returns to zero while keeping the low-resistance state (4). The resistance of the thin film changes from high-resistance to low-resistance by the processing as stated above. Namely, a "set" process appears. This low-resistance state is kept even though the voltage is not applied. Incidentally, the reason why the current limit is set is because a large current may flow in the thin film to be broken without the current limit.

On the other hand, when the voltage is applied to the low-resistance state thin film (5), the resistance increases rapidly at a certain voltage (approximately at 1.2 V), and the current decreases rapidly (6). After that, the current returns to "0" (zero) while keeping the high resistance state if the voltage is lowered (7). The resistance of the thin film changes from low-resistance to high-resistance by the processing as stated above. Namely, a "reset" process appears. This high-resistance state is kept even though the voltage is not applied.

Accordingly, it becomes also possible to use the unipolar material as a memory by corresponding the high-resistance state and the low-resistance state to "0" (zero) and "1" respectively. Namely, in an example illustrated in FIG. 12, it is possible to identify the resistance of the unipolar material from the current value when the voltage of approximately 0.2 V is applied, and to identify which is stored either "0" (zero) or "1" from the identified resistance.

The changes of the resistances of the bipolar material and the unipolar material as stated above do not appear from just after a formation of the thin film and so on, but appear after a dielectric breakdown is occurred by applying a relatively large voltage to the thin film and so on, or a phenomenon resembling to the dielectric breakdown occurs. The phenomenon and the process thereof occurred by the processing as stated above are sometimes called as a "forming". It is considered that a conductive region called as a filament is generated by the forming process, and the resistance changes caused by a change of the characteristics in the filament. The changes of the characteristics of a $TiO_x$ film in each processing are illustrated in FIG. 13A to FIG. 13C. FIG. 13A is a graphic chart illustrating a change of a current in the forming process, FIG. 13B is a graphic chart illustrating the change of the current in the set process, and FIG. 13C is a graphic chart illustrating the change of the current in the reset process.

Incidentally, arrows in the respective graphic charts represent directions of the changes of the currents.

As illustrated in FIG. 13A, the resistance of the $TiO_x$ film just after it is formed is high, and the current does not increase rapidly without applying the voltage of approximately 8 V in the forming process. Incidentally, the current limit (the limit value: 10 mA) is also set in the forming process.

The voltage is applied again to the $TiO_x$ film of which forming process is completed, then the resistance decreases rapidly when the voltage of approximately 2.5 V is applied as illustrated in FIG. 13B. The low-resistance state is kept even though the applied voltage is set to be zero. Namely, the processing of the set process is performed.

After that, the voltage is applied again to the $TiO_x$ film of which set process is completed, then the current increases quickly as illustrated in FIG. 13C, but the resistance increases rapidly when the voltage of approximately 1.2 V is applied. The high-resistance state is kept even if the applied voltage is set to be zero. Namely, the processing of the reset process is performed.

After that, the set process or the reset process appears in accordance with the value of the resistance and the applied voltage. Incidentally, there is a case when not the set process but the reset process appears just after the forming process because the resistance of the $TiO_x$ film of which forming process is completed is low depending on a value and so on of the limited current at the time of the forming process. After that, only the set process or the reset process appears in accordance with the value of the resistance and the applied voltage, also in this case. Namely, the forming process appears only first one time without applying a thermal stress and so on.

A resistance change memory is expected as an alternative memory of a flash memory of which scaling limit is approximating. However, it is necessary to apply a high voltage for the forming process of $TiO_x$ as stated above. Accordingly, an appropriate selection and so on of materials is necessary. It is verified that the forming process completes with a lower voltage than $TiO_x$ when $NiO_x$ is used, from a result of an experiment performed by the present inventors and so on. Accordingly, it is conceivable that the usage of $NiO_x$ is effective.

However, the present inventors have found out that there is a tendency in which the voltage necessary for the forming process (forming voltage) becomes high as the memory cell becomes small, and that it is difficult to decrease the forming voltage to a degree matches with a driving voltage of the other elements even when $NiO_x$ is used.

Patent Document 1: Japanese Laid-open Patent Publication No. 2004-241396

Patent Document 2: Japanese Laid-open Patent Publication No. 2004-363604

Non-Patent Document 1: A. Beck et al., Apply. Phys., Lett. 77, 139 (2001)

Non-Patent Document 2: I. G. Baek et al., Tech. Digest IEDM 2004, p. 587

SUMMARY

Here, experiments performed by the present inventors are described. FIG. 1A is a graphic chart illustrating a change of a current in a forming process of a first sample. FIG. 1B is a graphic chart illustrating a change of a current in a forming process of a second sample. In the first sample, a planar shape thereof is a square of which length of one side is 170 μm. In the second sample, a planar shape thereof is a square of which length of one side is 1.5 μm. Besides, an $NiO_x$ film is formed between two electrodes. The forming voltages are then measured.

Though the forming voltage of the large first sample is approximately 1 V as illustrated in FIG. 1A, the forming voltage of the minute second sample is 3 V or more as illustrated in FIG. 1B. A size of a memory cell of a resistance change memory which is produced and distributed is considered to be 100 nm or less, and therefore, a very large forming voltage becomes necessary if nothing is done.

Accordingly, the present inventors performed an observation of a CAFM (Conductive Atomic Force Microscopy) image of the $NiO_x$ film to investigate a cause of the high forming voltage. FIG. 2 is a view (photomicrograph) illustrating the CAFM image of the $NiO_x$ film. In the CAFM image, resistance is low as a region is bright. Regions R1 and R2 in FIG. 2 are both square regions of which length of one side is 100 nm. Though the region R1 is occupied by a portion of which resistance is high (a portion with small current), there are portions of which resistances are low (portions with large current) in the region R2. The forming voltage of the corresponding memory cell does not become very high if the portion of which resistance is low is included in one memory cell such as the region R2. But, the forming voltage becomes high when the portion of which resistance is low is not included in one memory cell such as the region R1. It is conceivable that the portion of which resistance is low is a portion of which oxidation of Ni is relatively low or a crystal grain boundary. Accordingly, it is conceivable that the memory cell of which forming voltage is high is easy to be formed as the memory cell becomes small, because a frequency occupied by the portion of which resistance is high becomes high.

Besides, the present inventors formed a nickel oxide film on a Pt film used as a bottom electrode in a conventional resistance change memory under various conditions, and performed an observation of cross-section SEM (Scanning Electron Microscopy) images. FIG. 3A is a view (photomicrograph) illustrating a cross-section SEM image of a sample S1, FIG. 3B is a view (photomicrograph) illustrating a cross-section SEM image of a sample S2, FIG. 3C is a view (photomicrograph) illustrating a cross-section SEM image of a sample S3, and FIG. 3D is a view (photomicrograph) illustrating a cross-section SEM image of a sample S4. In the sample S1, the nickel oxide film was formed by performing an annealing of an Ni film at 395° C. for 30 minutes under an oxygen atmosphere of 101325 Pa (1 atm) after the Ni film was formed on the Pt film. In the sample S2, a nickel oxide film was formed by performing the annealing of an Ni film at 395° C. for 60 minutes under the oxygen atmosphere of 101325 Pa (1 atm) after the Ni film was formed on the Pt film. In the sample S3, a nickel oxide film was formed by performing the annealing of an Ni film at 435° C. for 60 minutes under the oxygen atmosphere of 101325 Pa (1 atm) after the Ni film was formed on the Pt film. In the sample S4, a nickel oxide film was formed by performing the annealing of an Ni film at 485° C. for 60 minutes after the Ni film was formed on the Pt film under the oxygen atmosphere of 101325 Pa (1 atm).

As it can be seen from FIG. 3A and FIG. 3B, a size of a crystal grain became large as the annealing time was long. This indicates that there is a tendency in which the forming voltage becomes high as the annealing time becomes long. Besides, as it is illustrated in FIG. 3B to FIG. 3D, the size of the crystal grain became large as the annealing temperature was high. This indicates that there is a tendency in which the forming voltage becomes high as the annealing temperature becomes high.

Besides, the present inventors performed XPS analyses of the nickel oxide films of the samples S1 to S4. Results thereof are illustrated in FIG. 4. As illustrated in FIG. 4, an oxidation degree (oxygen content/nickel content) of the nickel oxide film of the sample S1 was 0.81. Besides, the oxidation degree of the sample S2 as 0.84, the oxidation degree of the sample S3 was 0.85, and the oxidation degree of the sample S4 was 0.86. As stated above, a result is obtained in which the oxidation degree is low as the crystal grain is small.

As it is studied from the experimental results as stated above, it is conceivable that it becomes possible to widely secure the portion of which resistance is low and to obtain the resistance change memory of which forming voltage is low by suppressing the oxidation of a metallic element in a conductive oxide such as Ni into relatively low level, and by miniaturizing the crystal grain.

However, just lowering the annealing temperature does not facilitate the oxidation of Ni and so on, and therefore, a time required for oxidation to a degree changing from a metal film to a conductive oxide film becomes very long. Besides, just shortening the annealing time does not facilitate the oxidation of Ni and so on, and therefore, a temperature required for oxidation to a degree changing from the metal film to the conductive oxide film becomes very high. Namely, it is difficult to perform an adjustment of the oxidation and the crystal grain diameter only by adjusting the annealing temperature and the annealing time.

The present inventors studied very hard based on the observations as stated above, and as a result, they reach each aspect of embodiments as illustrated hereinafter.

According to an aspect of the embodiment, a first semiconductor device includes: a first electrode; a metal-containing film formed on the first electrode and containing metallic atoms; a resistance change film formed on the metal-containing film and containing metal oxide; and a second electrode formed on the resistance change film. The metal-containing film is composed of a substance which is easier to bond with oxygen than a substance composing the resistance change film. A resistance of the resistance change film changes in accordance with a voltage applied between the first electrode and the second electrode.

According to another aspect of the embodiment, in a manufacturing method of a semiconductor device, a metal-containing film containing metallic atoms is formed on a first electrode, and a resistance change film containing metal oxide is formed on the metal-containing film. A second electrode is formed on the resistance change film. As the metal-containing film, a film composed of a substance easier to bond with oxygen than a substance composing the resistance change film is formed. As the resistance change film, a film of which resistance changes in accordance with a voltage applied between the first electrode and the second electrode is formed.

The object and advantages of the invention will be realized and attained by means of the element and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
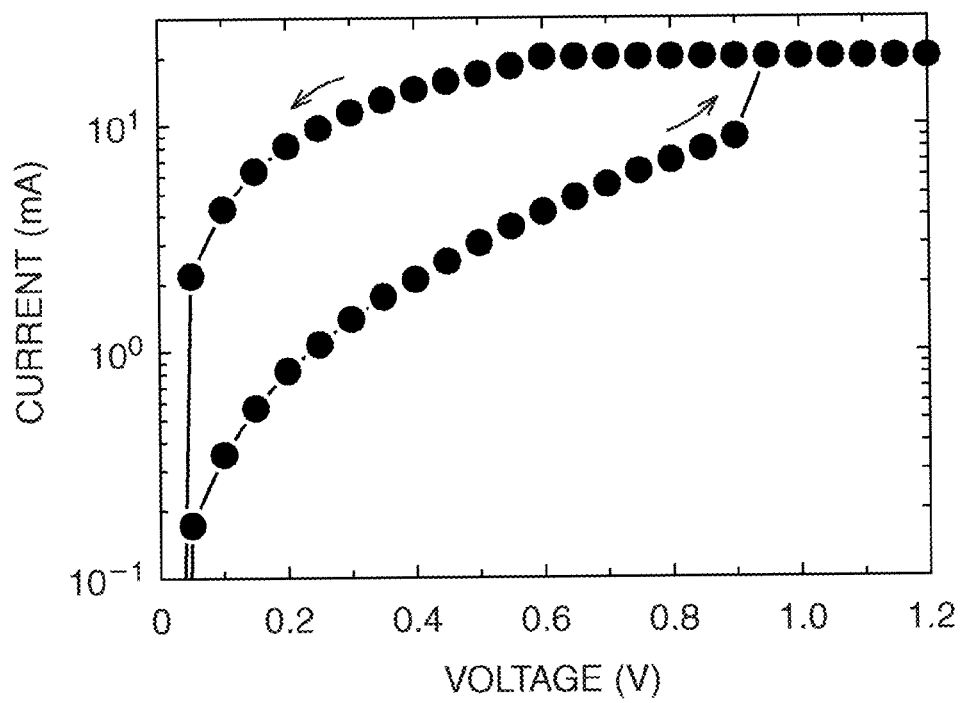
FIG. 1A is a graphic chart illustrating a change of a current in a forming process of a first sample.
Figure 1B:
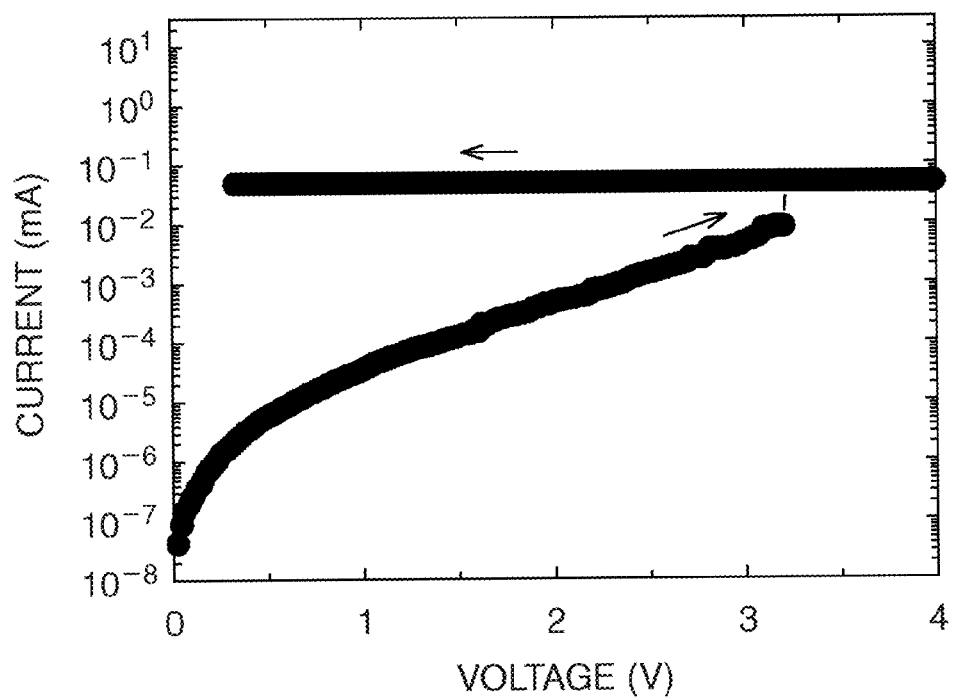
FIG. 1B is a graphic chart illustrating a change of a current in a forming process of a second sample.
Figure 2:
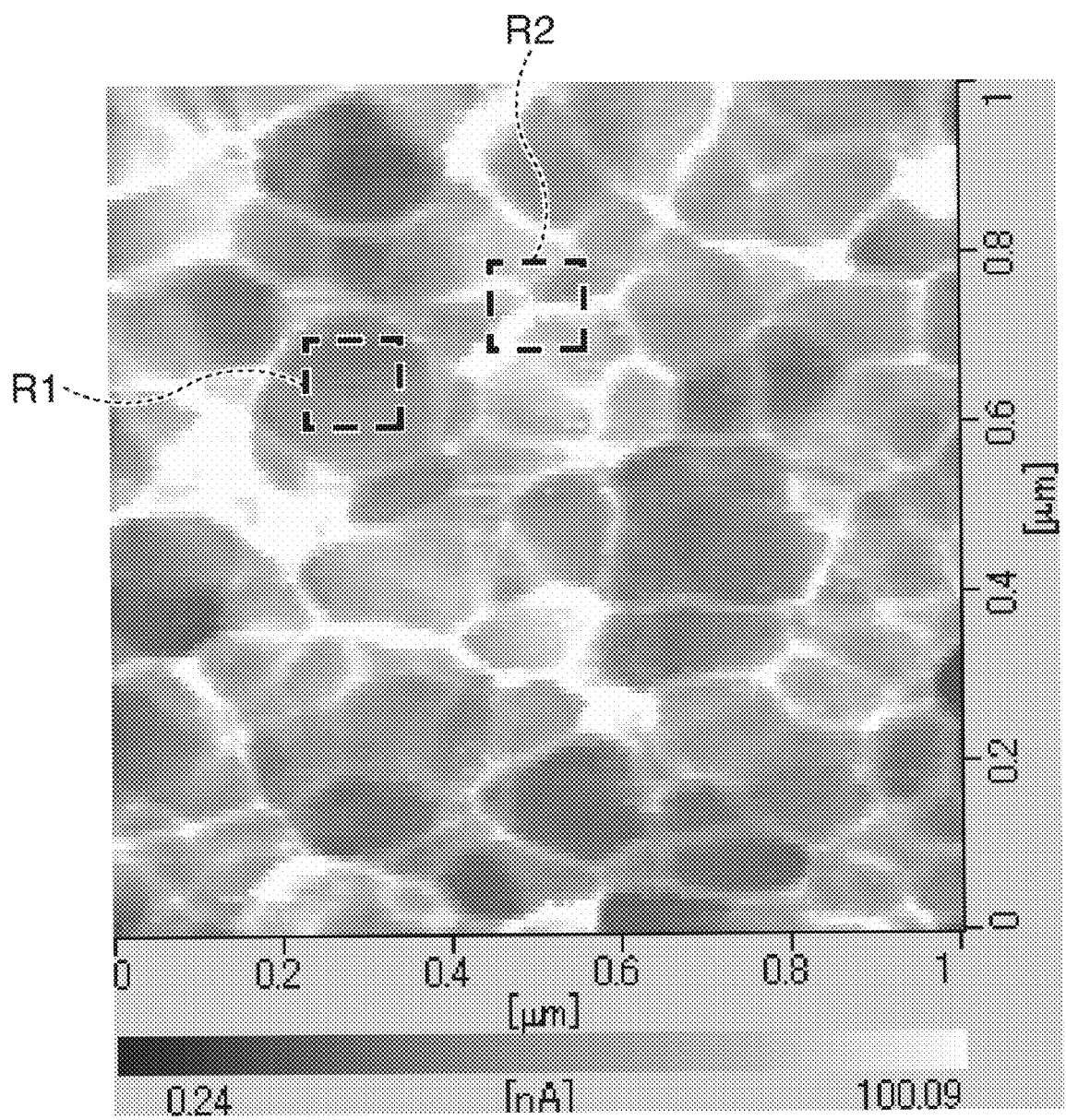
FIG. 2 is a view illustrating a CAFM image of an $NiO_x$ film.
Figure 3A:
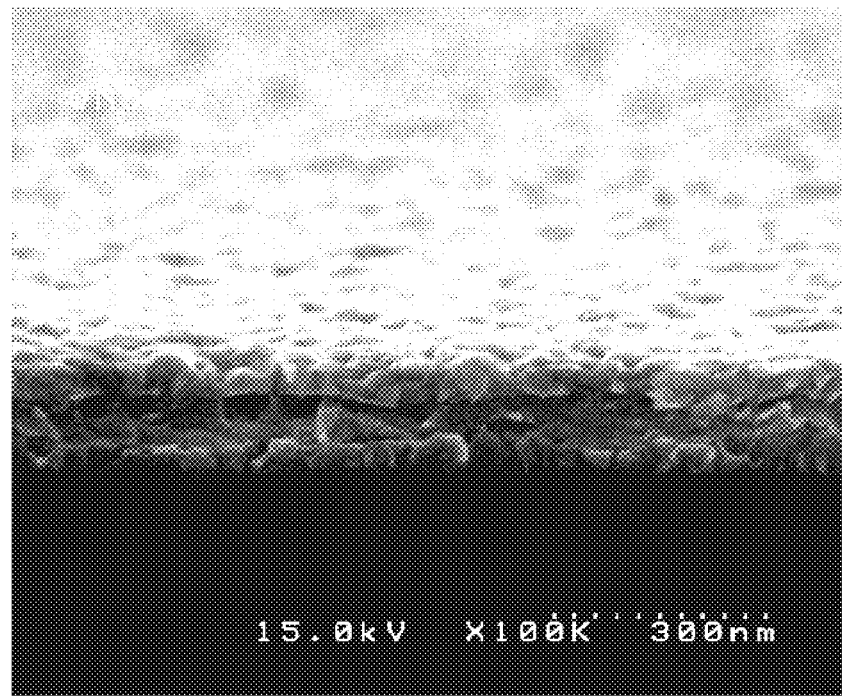
FIG. 3A is a view illustrating a cross-section SEM image of a sample S1.
Figure 3B:
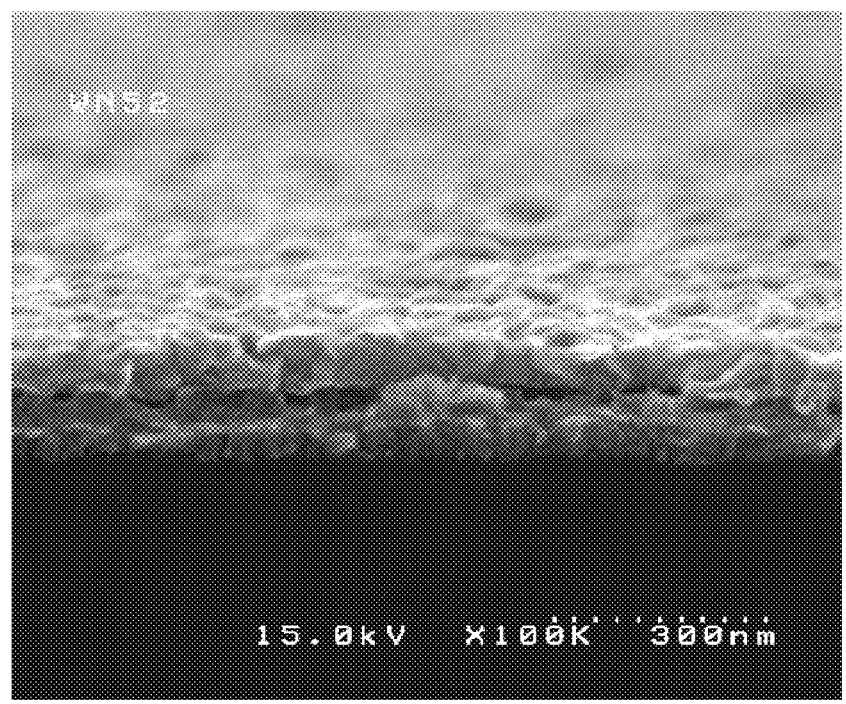
FIG. 3B is a view illustrating a cross-section SEM image of a sample S2.
Figure 3C:
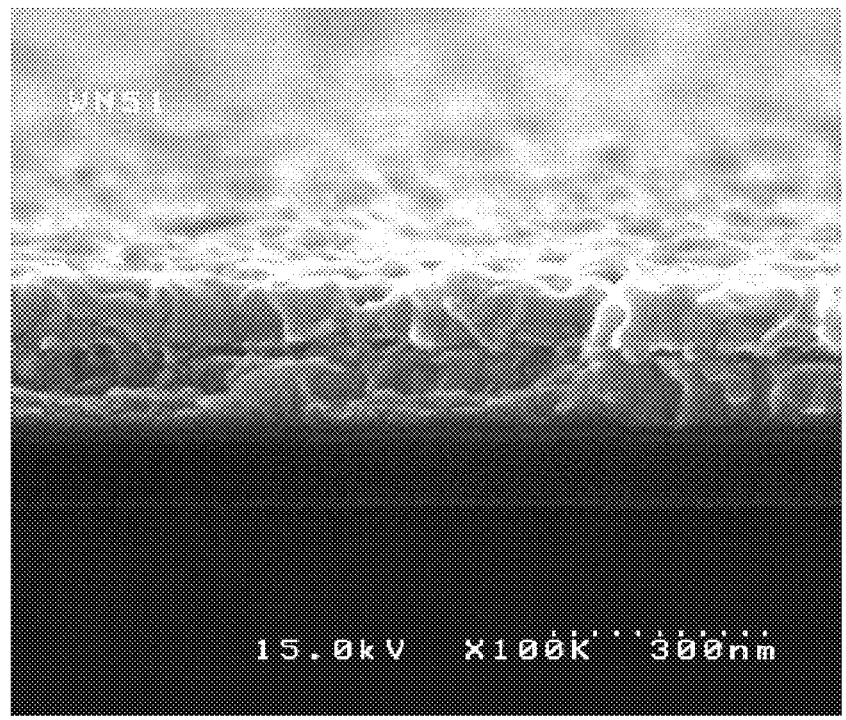
FIG. 3C is a view illustrating a cross-section SEM image of a sample S3.
Figure 3D:
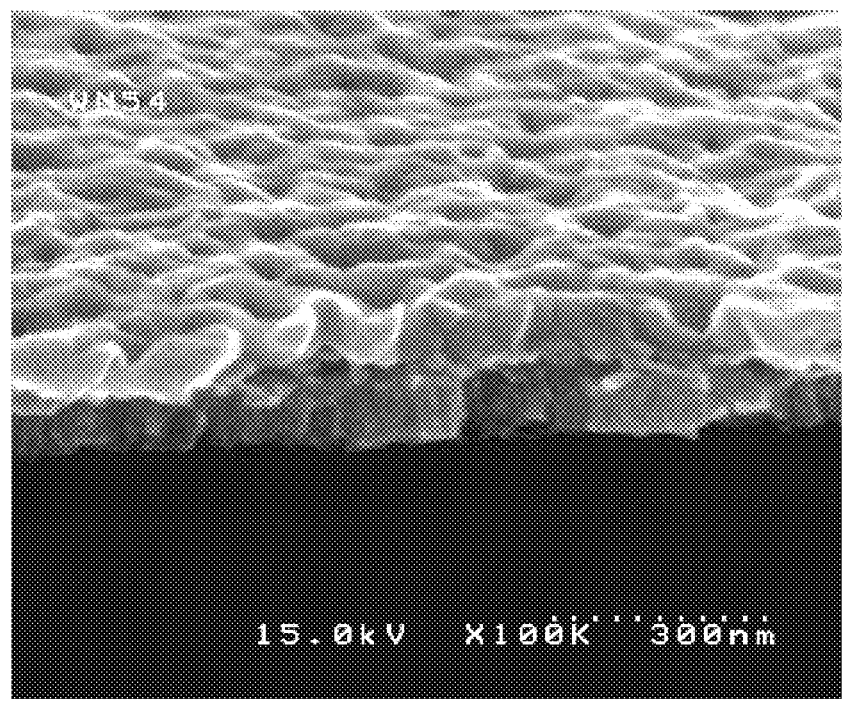
FIG. 3D is a view illustrating a cross-section SEM image of a sample S4.
Figure 4:
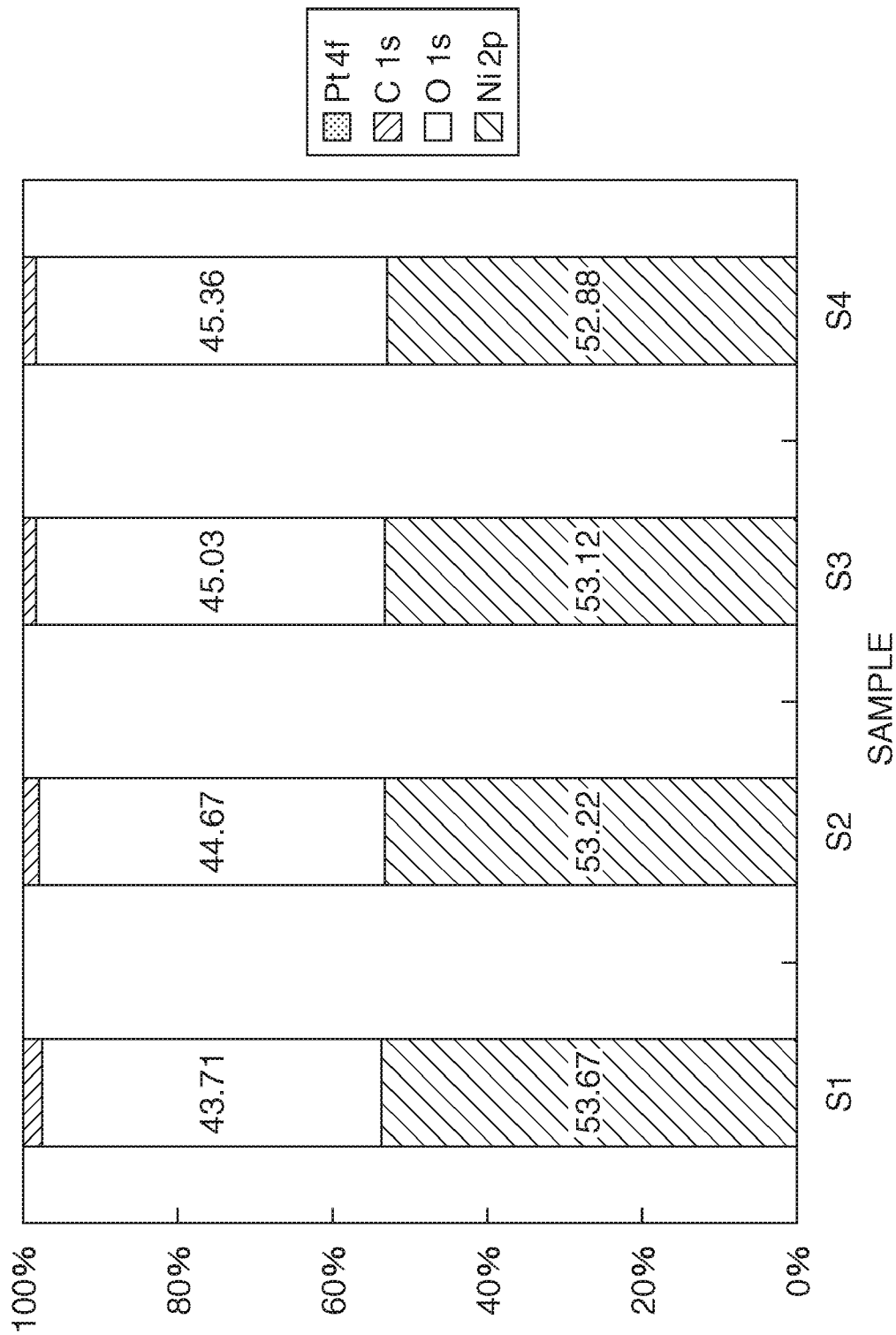
FIG. 4 is a graphic chart illustrating results of XPS analyses of the samples S1 to S4.
Figure 5A:
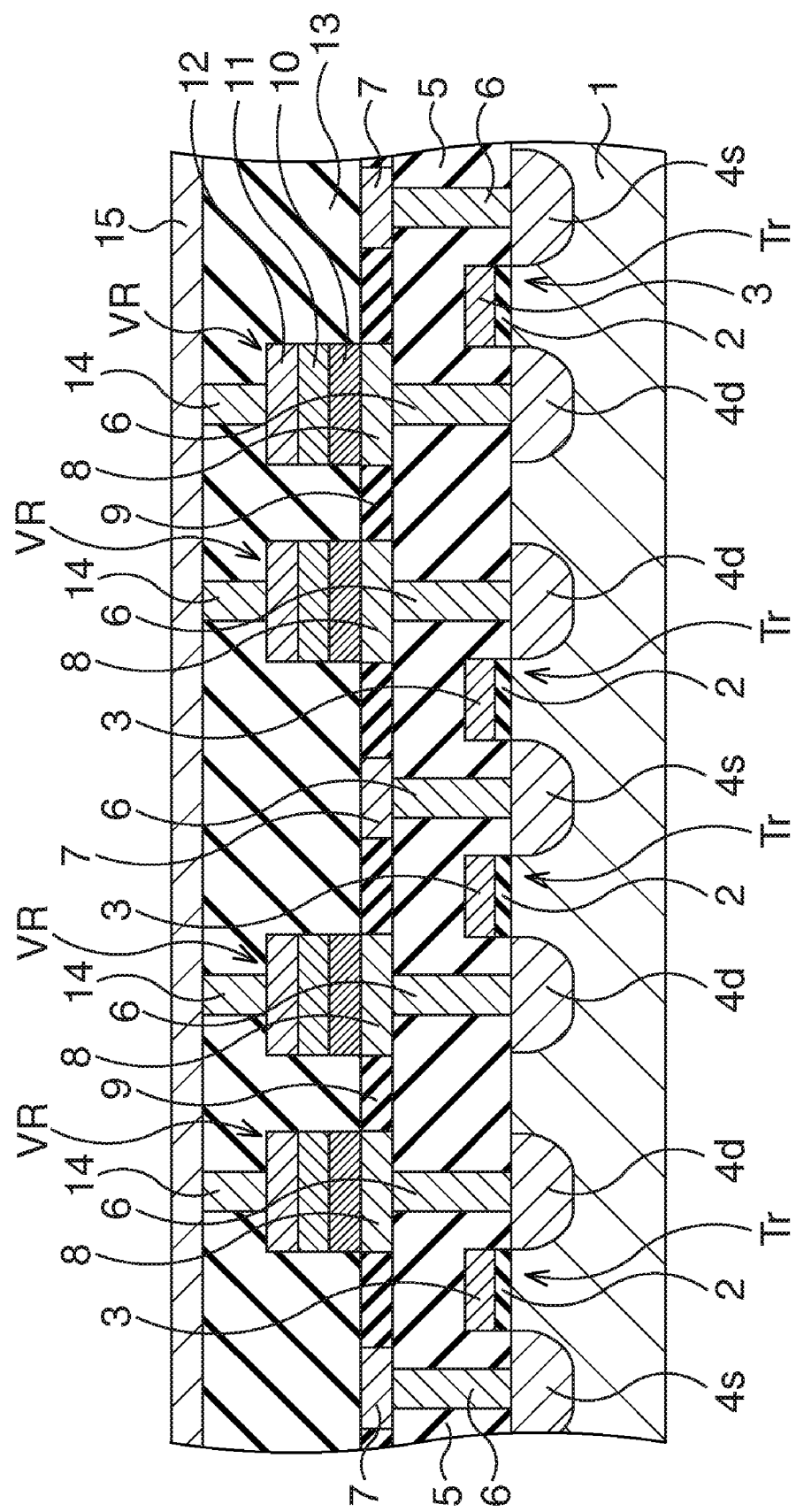
FIG. 5A is a sectional view illustrating a structure of a resistance change memory according to an embodiment.
Figure 5B:
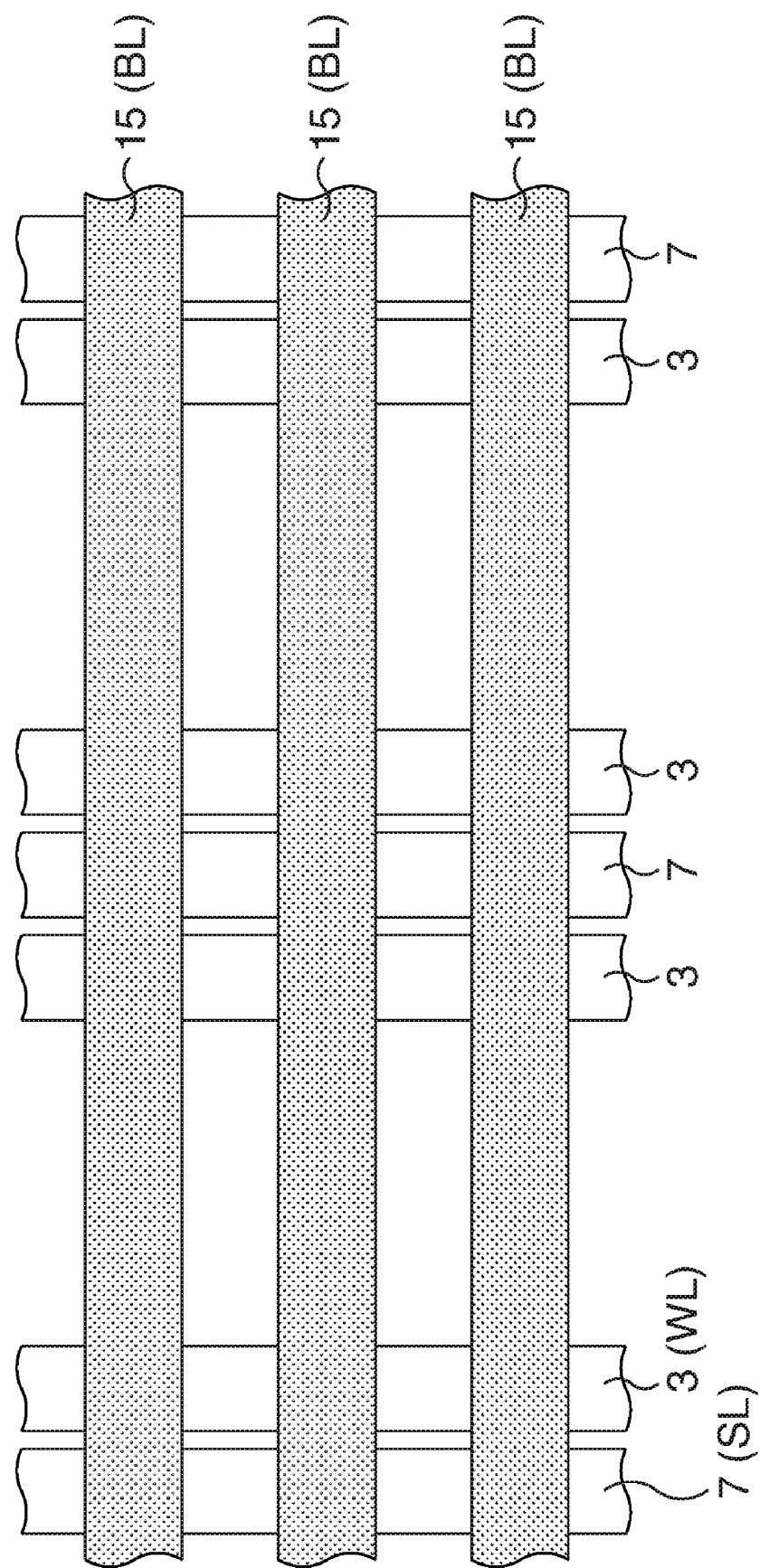
FIG. 5B is a layout diagram illustrating the structure of the resistance change memory according to the embodiment.

Hereinafter, embodiments are concretely described with reference to the attached drawings. FIG. 5A is a sectional view illustrating a structure of a semiconductor device (resistance change memory) according to the embodiment, and FIG. 5B is a layout diagram illustrating the structure of the semiconductor device (resistance change memory) according to the embodiment.

In the present embodiment, gate insulating films 2 and gate electrodes 3 are formed on a semiconductor substrate 1 of which conductive type of a surface is p-type. Besides, sources 4s and drains 4d of which conductive types are n-type are formed on the surface of the semiconductor substrate 1 so as to sandwich the gate electrodes 3 in a plain view. Transistors Tr are constituted as stated above. Incidentally, the drain 4d is independently formed for each of the transistors Tr, but the source 4s is commonly used by, for example, two transistors Tr adjacent with each other.

An interlayer insulating film 5 covering the transistors Tr is formed on the semiconductor substrate 1. The interlayer insulating film 5 is composed of, for example, silicon oxide. Contact holes reaching the sources 4s and contact holes reaching the drains 4d are formed in the interlayer insulating film 5, and contact plugs 6 are embedded inside thereof. Contact holes reaching the gate electrodes 3 are also formed in the interlayer insulating film 5, and contact plugs (not-illustrated) are also embedded inside thereof. Besides, a surface of the interlayer insulating film 5 is flattened.

Signal lines 7 (SL) which are in contact with the contact plugs 6 being in contact with the sources 4s and bottom electrodes 8 which are in contact with the contact plugs 6 being in contact with the drains 4d are formed on the interlayer insulating film 5. The signal line 7 (SL) and the bottom electrode 8 are composed of, for example, Pt. Besides, insulating films 9 are formed between the signal lines 7 (SL) and the bottom electrodes 8.

A titanium oxide film 10, a nickel oxide film 11 and a top electrode 12 are formed on the bottom electrode 8, and a resistance element VR is constituted by the bottom electrode 8, the titanium oxide film 10, the nickel oxide film 11 and the top electrode 12. A thickness of the titanium oxide film 10 is, for example, 5 nm, and a thickness of the nickel oxide film 11 is, for example, 60 nm. Besides, a rate of oxygen in nickel oxide composing the nickel oxide film 11 is lower than a rate of oxygen in a stoichiometric composition. The top electrode 12 is composed of, for example, Pt.

An interlayer insulating film 13 covering the signal lines 7 (SL) and the resistance elements VR is formed on the insulating films 9. The interlayer insulating film 13 is composed of, for example, silicon oxide. Contact holes reaching the top electrodes 12 are formed in the interlayer insulating film 13, and contact plugs 14 are embedded inside thereof. Besides, a surface of the interlayer insulating film 13 is flattened.

Bit lines 15 (BL) which are in contact with the plural contact plugs 14 are formed on the interlayer insulating film 13. The bit line 15 (BL) is composed of, for example, Cu. Other interlayer insulating films, wirings, and so on are further formed on the interlayer insulating film 13.

Figure 6:
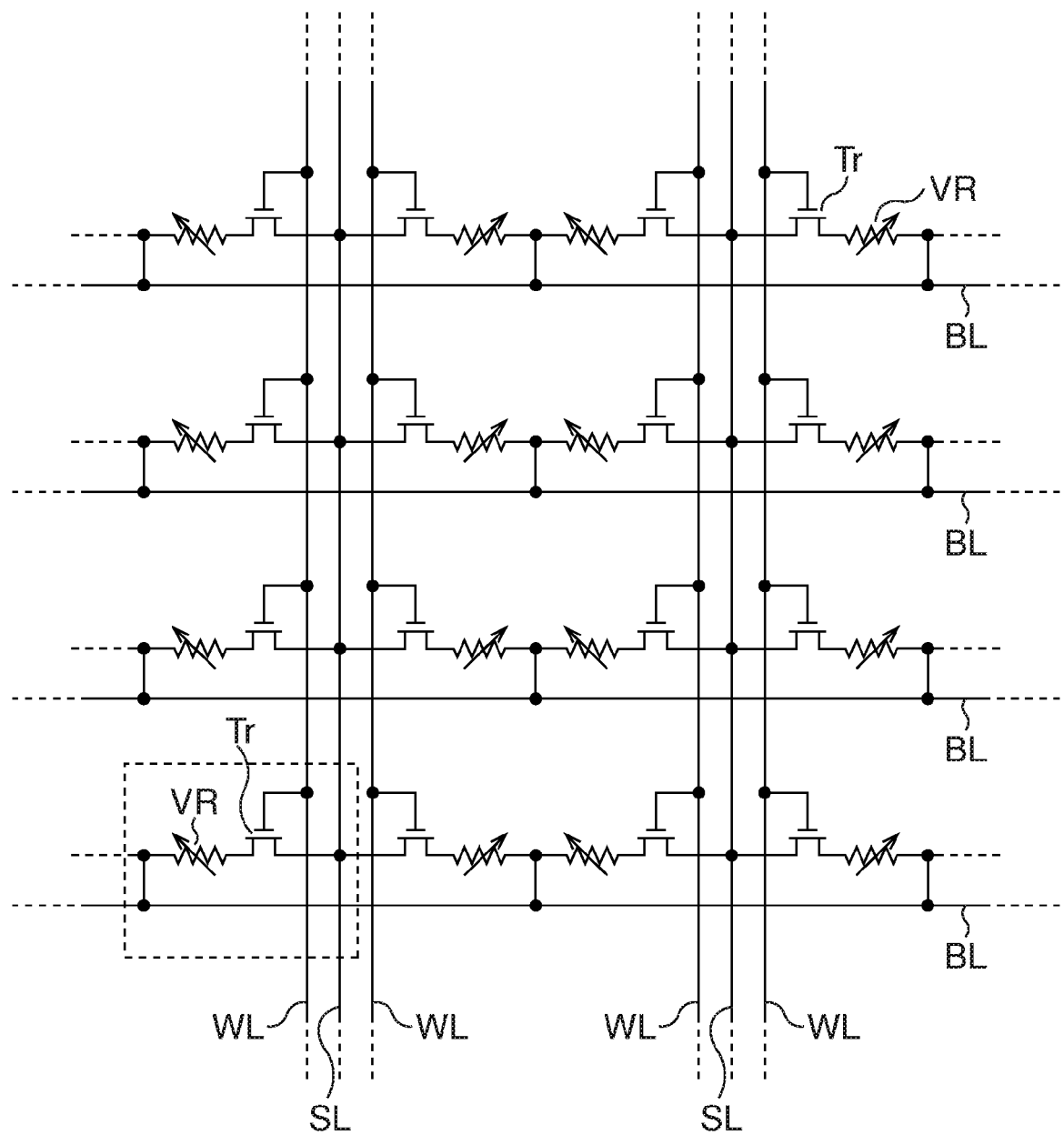
FIG. 6 is a circuit diagram illustrating a constitution of the resistance change memory according to the embodiment.

The bit lines 15 are provided in plural as illustrated in FIG. 5B, and these are extending in parallel with each other. Besides, the gate electrode 3 functions as a word line WL, and one signal line 7 (SL) is sandwiched by two word lines WL. FIG. 6 is a circuit diagram illustrating a constitution of a resistance change memory according to the embodiment, and FIG. 7 is a circuit diagram enlargedly illustrating an area surrounded by a dotted line in FIG. 6.

Figure 7:
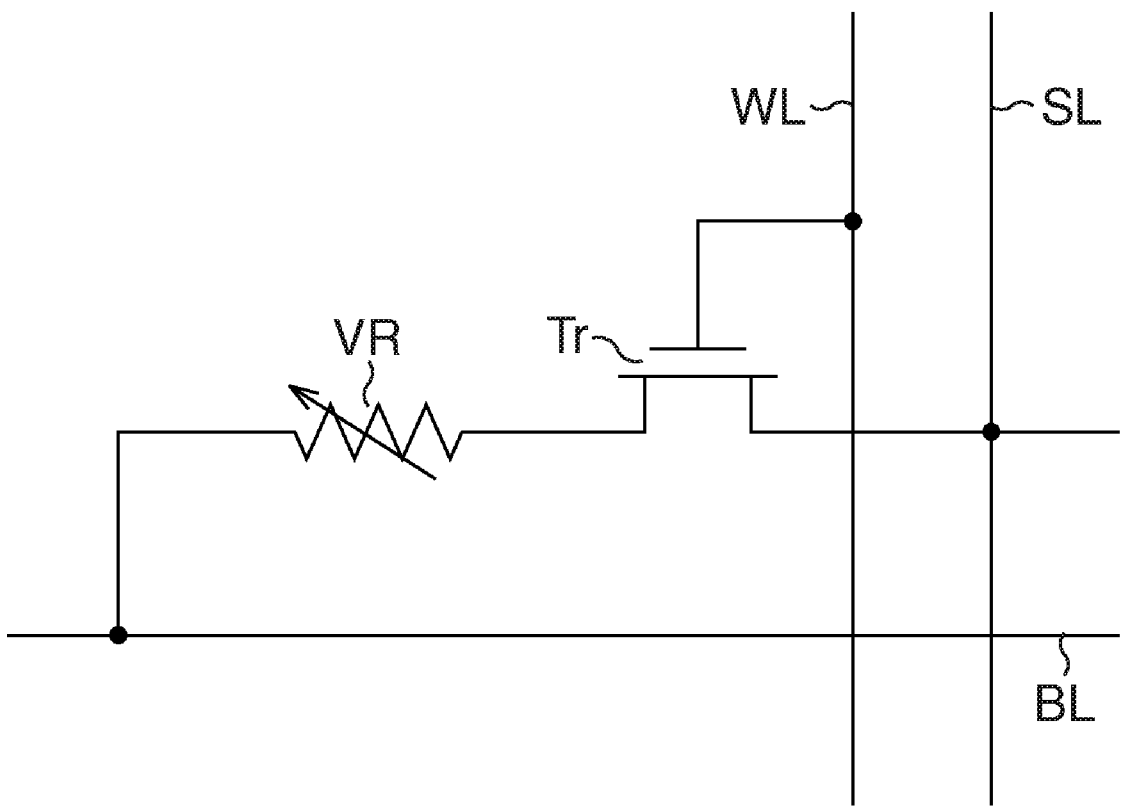
FIG. 7 is a circuit diagram enlargedly illustrating an area surrounded by a dotted line in FIG. 6.

As illustrated in FIG. 6 and FIG. 7, the signal lines SL extend in parallel with each other, and each one word line WL positions at both sides of each signal line SL. Besides, the bit lines BL intersect with these. The sources of two transistors Tr are commonly connected to the signal line SL in a vicinity of the intersection between the signal line SL and the bit line BL, and respective gates of these transistors Tr are connected to each of the two word lines WL sandwiching the signal line SL. Besides, the bottom electrode 8 of the resistance element VR is connected to the drain of the transistor Tr, and the top electrode 12 of the resistance element VR is connected to the bit line BL.

Besides, a write circuit storing information into the resistance element VR by changing a resistance of the nickel oxide film 11 is connected to the word line WL, the signal line SL and the bit line BL. Further, a read circuit reading information from the resistance element VR by judging the resistance of the nickel oxide film 11 is also connected to the signal line SL and the bit line BL.

In the resistance change memory constituted as stated above, the titanium oxide film 10 is formed under the nickel oxide film 11 functioning as a resistance change film at the resistance element VR. Titanium is easier to bond with oxygen than nickel. Namely, a difference ΔG of free energy of Gibbs before and after oxidation is approximately −210 kJ/mol at 395° C. in nickel oxide, but it is approximately −810 kJ/mol at 395° C. in titanium oxide. Accordingly, the oxidation of nickel is suppressed into low level and a crystal grain diameter becomes small when an annealing is performed at 395° C. for a structure in which a nickel film is formed on a titanium film in an atmosphere of which partial pressure of oxygen is 101325 Pa (1 atm), because oxygen preferentially bonds with titanium. As a result, a portion of which resistance is low is widely secured as it can be seen from the experiments performed by the present inventors as stated above. Accordingly, a forming voltage can be suppressed into low level.

Next, a manufacturing method of the resistance change memory according to the embodiment is described. FIG. 8A to FIG. 8H are sectional views illustrating the manufacturing method of the resistance change memory according to the embodiment in process sequence.

Figure 8A:
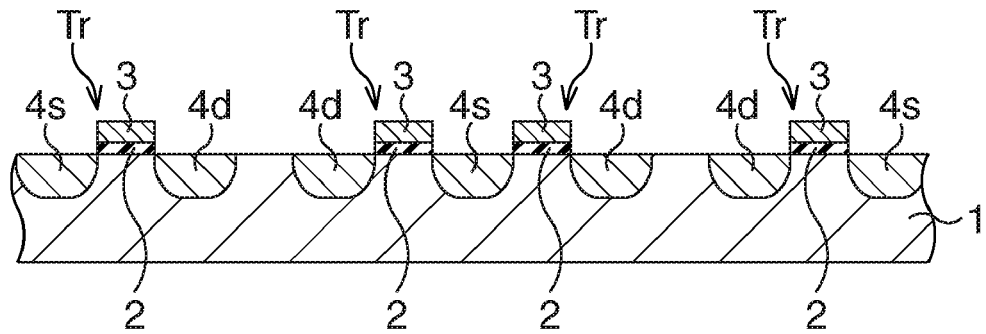
FIG. 8A to FIG. 8H are sectional views illustrating a manufacturing method of the resistance change memory according to the embodiment in a process sequence.

First, as illustrated in FIG. 8A, the transistors Tr are formed on the surface of the semiconductor substrate 1. When the transistor Tr is formed, first, the gate insulating film 2 and the gate electrode 3 are sequentially formed. Next, the source 4s and the drain 4d of which conductive types are n-type are formed on the surface of the semiconductor substrate 1 so as to sandwich the gate electrode 3 in the plain view. Incidentally, the source 4s is commonly used by two transistors Tr which are adjacent with each other.

Figure 8B:
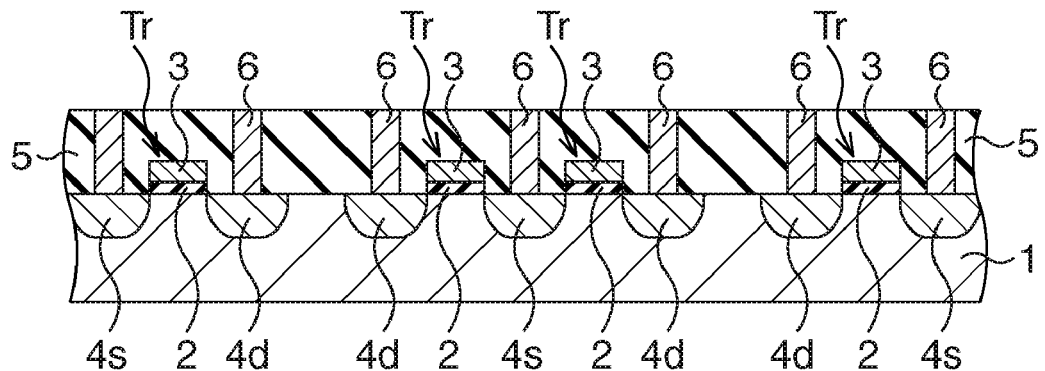

Next, as illustrated in FIG. 8B, the interlayer insulating film 5 covering the transistors Tr is formed. As the interlayer insulating film 5, for example, a silicon oxide film is formed. Next, the surface of the interlayer insulating film 5 is flattened. After that, the contact holes reaching the sources 4s and the contact holes reaching the drains 4d are formed in the interlayer insulating film 5, and the contact plugs 6 are embedded inside thereof. At this time, the formation of the contact holes reaching the gate electrodes 3 and the embedding of the contact plugs (not-illustrated) inside thereof are also performed.

Figure 8C:
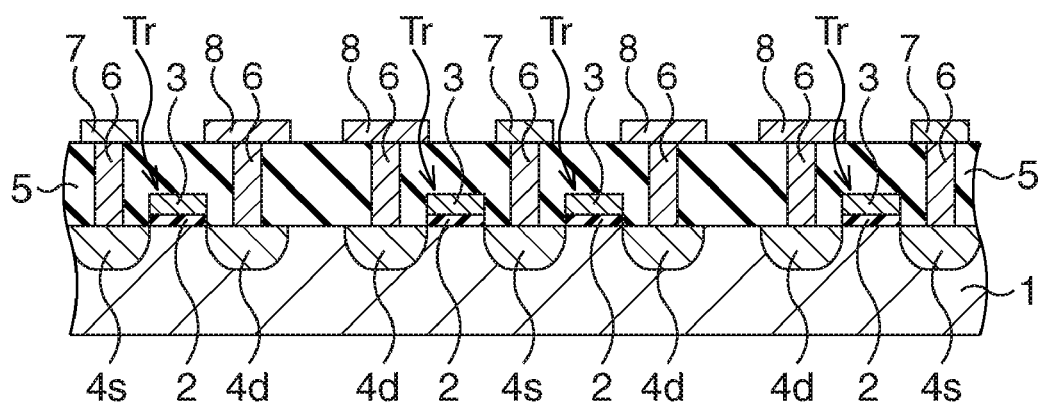

Subsequently, as illustrated in FIG. 8C, the signal lines 7 which are in contact with the contact plugs 6 being in contact with the sources 4s, and the bottom electrodes 8 which are in contact with the contact plugs 6 being in contact with the drains 4d are formed on the interlayer insulating film 5.

Figure 8D:
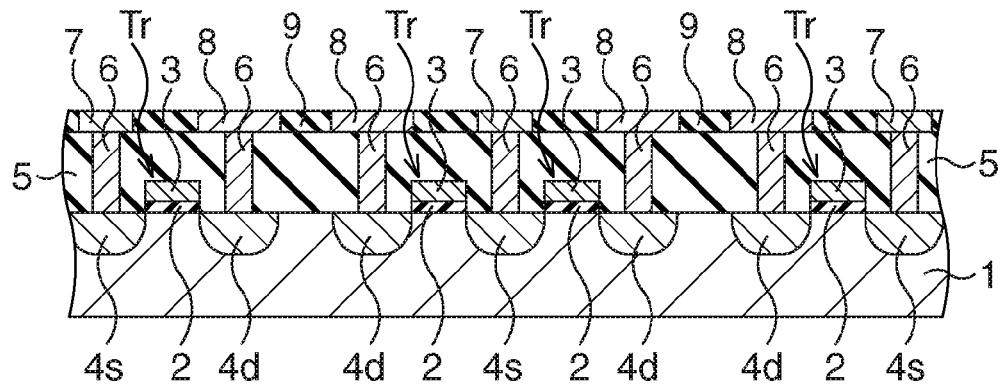

Next, as illustrated in FIG. 8D, the insulating films 9 are formed in gaps between the signal lines 7 and the bottom electrodes 8. As the insulating film 9, for example, a silicon oxide film is formed.

Figure 8E:
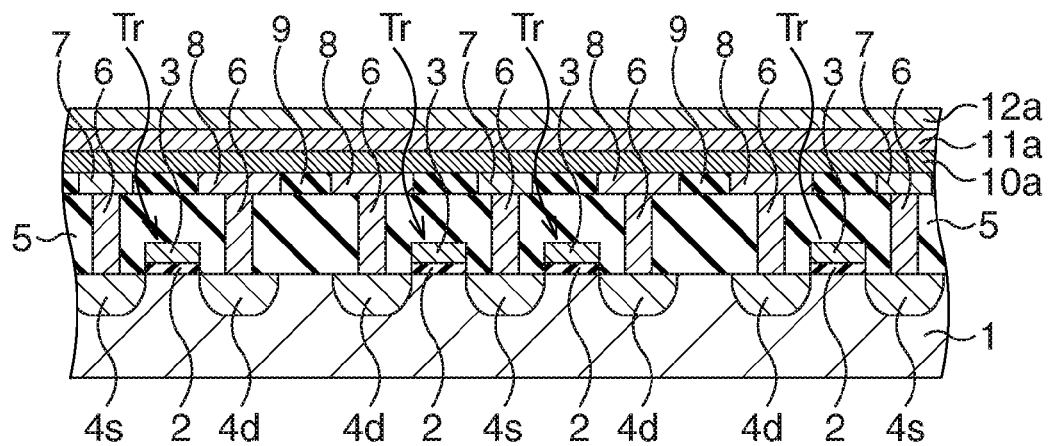

Next, as illustrated in FIG. 8E, a titanium film of which thickness is approximately 5 nm is formed on the signal lines 7, the bottom electrodes 8 and the insulating films 9 by a sputtering method, a CVD method, or the like. Subsequently, the titanium film is changed into a titanium oxide film 10a by performing an annealing at 550° C. for 30 minutes in an atmosphere in which the partial pressure of oxygen is 101325 Pa (1 atm). At this time, a composition of titanium oxide is short of oxygen than the stoichiometric composition.

After that, a nickel film of which thickness is approximately 60 nm is formed on the titanium oxide film 10a by a sputtering method, a CVD method, or the like. Subsequently, the nickel film is changed into a nickel oxide film 11a by performing an annealing at 395° C. for 30 minutes in an atmosphere in which the partial pressure of oxygen is 101325 Pa (1 atm). At this time, titanium oxide being short of oxygen than the stoichiometric composition is easier to bond with oxygen than nickel, and therefore, the oxidation of nickel is suppressed, and the nickel oxide film 11a becomes an oxide film of which oxidation degree is low. Besides, the crystal grain diameter thereof becomes relatively small.

Next, a top electrode film 12a is formed on the nickel oxide film 11a. As the top electrode film 12a, for example, a Pt film is formed.

Figure 8F:
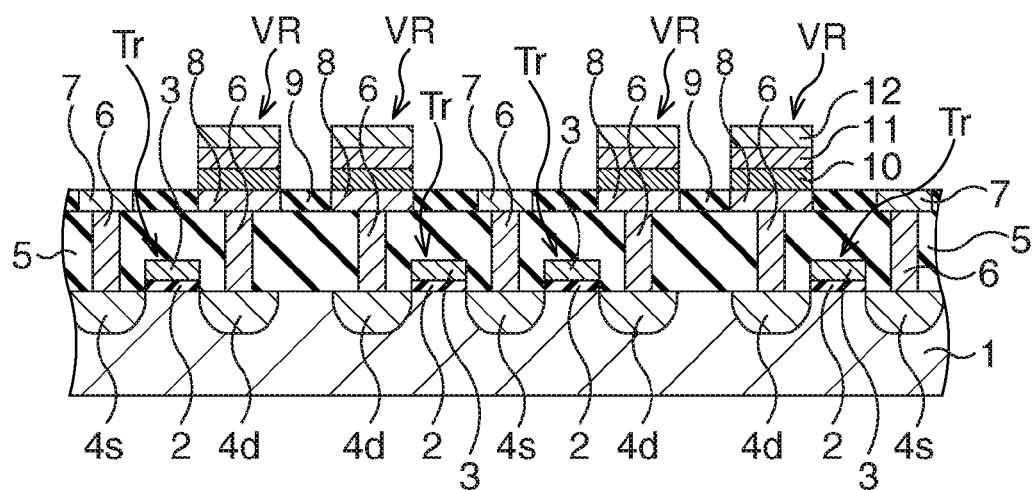

Next, as illustrated in FIG. 8F, the top electrodes 12, the nickel oxide films 11 and the titanium oxide films 10 are formed by performing a patterning of the top electrode film 12a, the nickel oxide film 11a and the titanium oxide film 10a. As a result, the resistance elements VR are obtained.

Figure 8G:
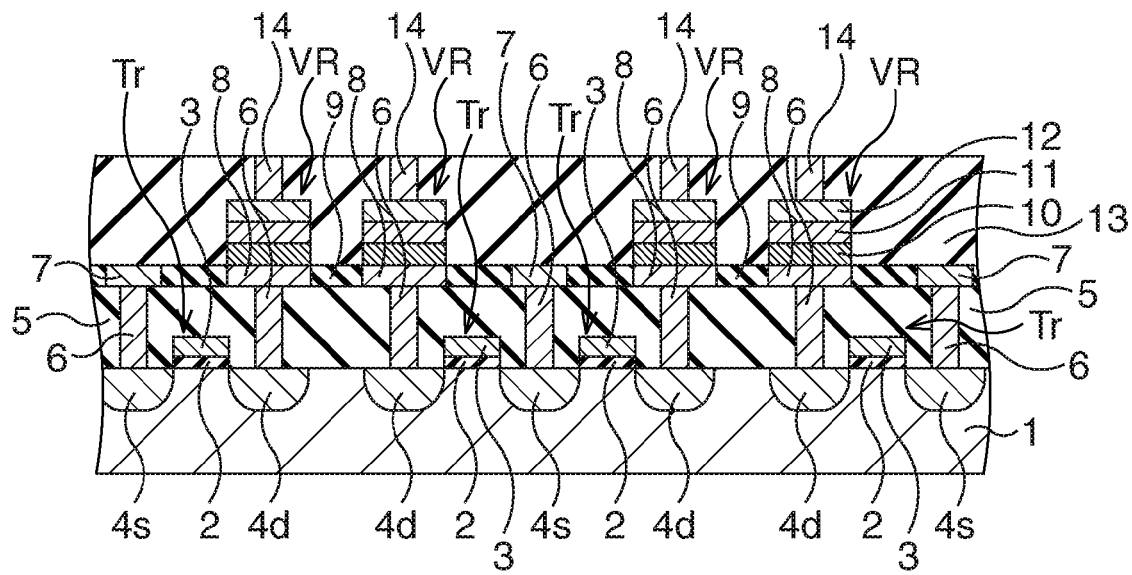
Figure 8H:
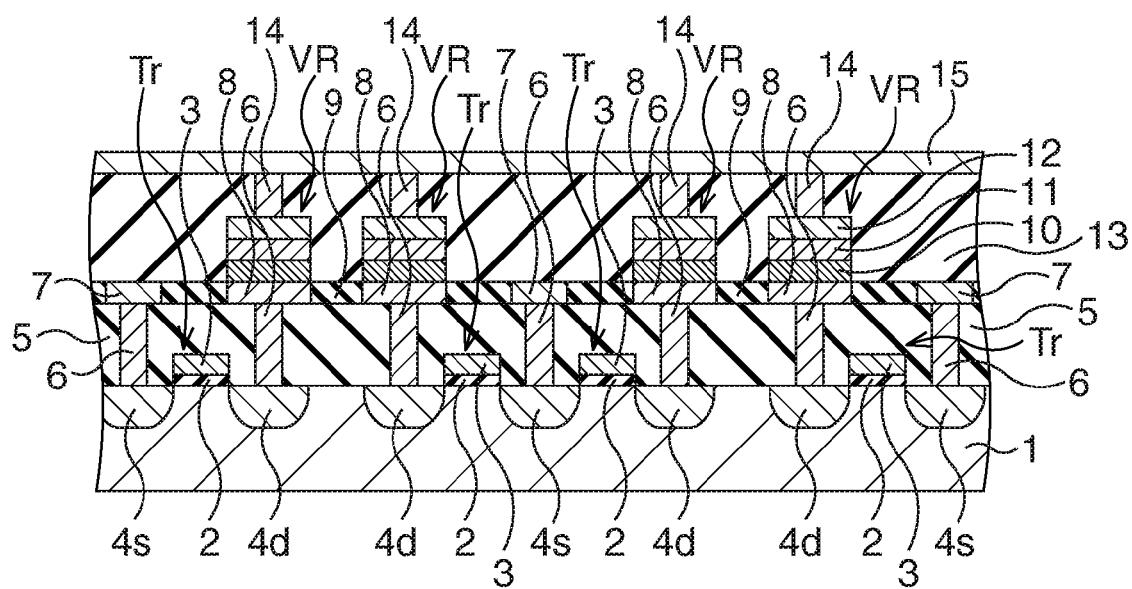

After that, as illustrated in FIG. 8G, the interlayer insulating film 13 covering the signal lines 7 and the resistance elements VR is formed. As the interlayer insulating film 13, for example, a silicon oxide film is formed. Next, the surface of the interlayer insulating film 13 is flattened. Subsequently, the contact holes reaching the top electrodes 12 are formed in the interlayer insulating film 13, and the contact plugs 14 are embedded inside thereof.

The bit lines 15 which are in contact with the contact plugs 14 are formed on the interlayer insulating film 13. After that, other interlayer insulating films, wirings, and so on are further formed on the interlayer insulating film 13. As a result, the resistance change memory is completed.

According to the method as stated above, it is possible to suppress the forming voltage into low level by appropriately generating oxygen deficiency at the nickel oxide film 11. Incidentally, in this method, the nickel film is not formed on a titanium film, but formed on the titanium oxide film 10a when the nickel oxide film 11a is formed. This is because the ΔG of titanium oxide becomes significantly large compared to that of nickel oxide, and therefore, an excessive oxygen deficiency may occur at the nickel oxide film 11a when the nickel film is formed on the titanium film. There is a case when it does not function as a resistance change film if the excessive oxygen deficiency occurs, because a lot of carriers are injected, and the resistance decreases largely. On the other hand, when the nickel film is formed on the titanium oxide film 10a, the degree of the oxygen deficiency is easy to be an appropriate level.

Incidentally, a forming method of the nickel oxide film 11a is not limited to the method performing oxidation of the nickel film formed by the sputtering method, the CVD method, or the like. For example, the nickel oxide film 11a may be formed by a reactive sputtering method such as an oxygen reactive sputtering method. In this case, the titanium film may be used as it is without performing the oxidation, because nickel within the nickel oxide film 11a is easier to bond with oxygen than the above-stated method.

Besides, materials of the resistance change film and the metal-containing film under the resistance change film are not particularly limited. As the material of the resistance change film, for example, titanium oxide, nickel oxide, yttrium oxide, cerium oxide, magnesium oxide, zinc oxide, zirconium oxide, tungsten oxide, niobium oxide, tantalum oxide, chromium oxide, manganese oxide, aluminum oxide, vanadium oxide and silicon oxide can be cited. Besides, the metal-containing film may be composed of a substance easier to bond with oxygen than a substance composing the resistance change film. For example, it is preferable that a metal of which energy difference ΔG relative to the oxidation reaction is smaller than the substance composing the resistance change film or the one the above-stated metal is oxidized for some extent is to be used as the material of the metal-containing film.

Further, a material of the top electrode is not also limited. For example, Pt, Ir, W, Ni, Au, Cu, Ag, Pd, Zn, Cr, Al, Mn, Ta, Si, TaN, TiN, $Si_3N_4$, Ru, ITO, NiO, IrO, SrRuO, $CoSi_2$, $WSi_2$, NiSi, $MoSi_2$, $TiSi_2$, Al—Si, Al—Cu, Al—Si—Cu, or the like can be used.

Next, contents and results of the experiments performed by the present inventors are described.

FIRST EXPERIMENT

In a first experiment, two kinds of samples (sample A and sample B) were manufactured, and observations of CAFM images thereof were performed. In the manufacture of the sample A, a nickel film (thickness: 60 nm) was formed on a Pt substrate by a sputtering method, and the nickel film was changed into a nickel oxide film by performing an annealing at 395° C. for 30 minutes in an atmosphere in which the partial pressure of oxygen is 101325 Pa (1 atm). In the manufacture of the sample B, first, a titanium film (60 nm) was formed on a Pt substrate by a sputtering method, and the titanium film was changed into a titanium oxide film by performing an annealing at 550° C. for 30 minutes in an atmosphere in which the partial pressure of oxygen is 101325 Pa (1 atm). Next, a nickel film (thickness: 60 nm) was formed on the titanium oxide film by a sputtering method, and the nickel film was changed into a nickel oxide film by performing an annealing at 395° C. for 30 minutes in an atmosphere in which the partial pressure of oxygen is 101325 Pa (1 atm). The CAFM image of the sample A is illustrated in FIG. 9A, and the CAFM image of the sample B is illustrated in FIG. 9B.

Figure 9A:
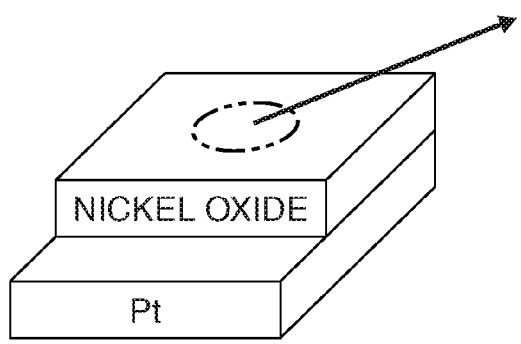
FIG. 9A is a view illustrating a CAFM image of a sample A.
Figure 9A:
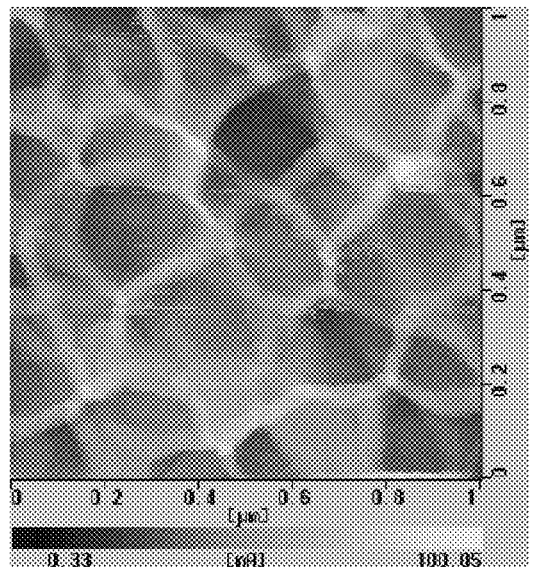
Figure 9B:
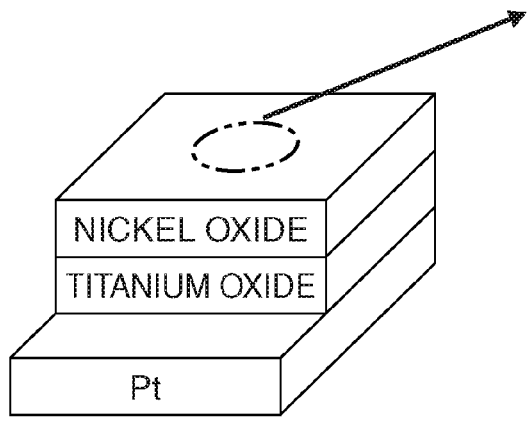
FIG. 9B is a view illustrating a CAFM image of a sample B.
Figure 9B:
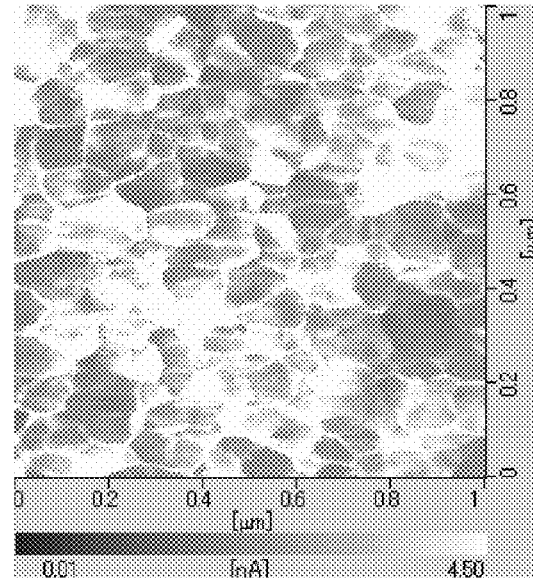

As illustrated in FIG. 9A and FIG. 9B, there were a lot of low-resistance regions in the sample B. This is because the oxygen deficiency was easy to occur in nickel oxide resulting from the existence of titanium oxide in the sample B, but the oxygen deficiency was difficult to occur in the sample A, and a composition of nickel oxide approximated to the stoichiometric composition more than the second sample.

SECOND EXPERIMENT

In a second experiment, two kinds of samples (sample C and sample D) were manufactured, and forming voltages thereof were measured. The sample C was manufactured by a similar method to the sample B except that the thickness of the titanium oxide film was set to be 5 nm. The sample D was manufactured by a similar method to the sample B except that the thickness of the titanium oxide film was set to be 10 nm. A graphic chart representing a change of a current in a forming process of the sample C is illustrated in FIG. 10A, and a graphic chart representing a change of a current in a forming process of the sample D is illustrated in FIG. 10B.

Figure 10A:
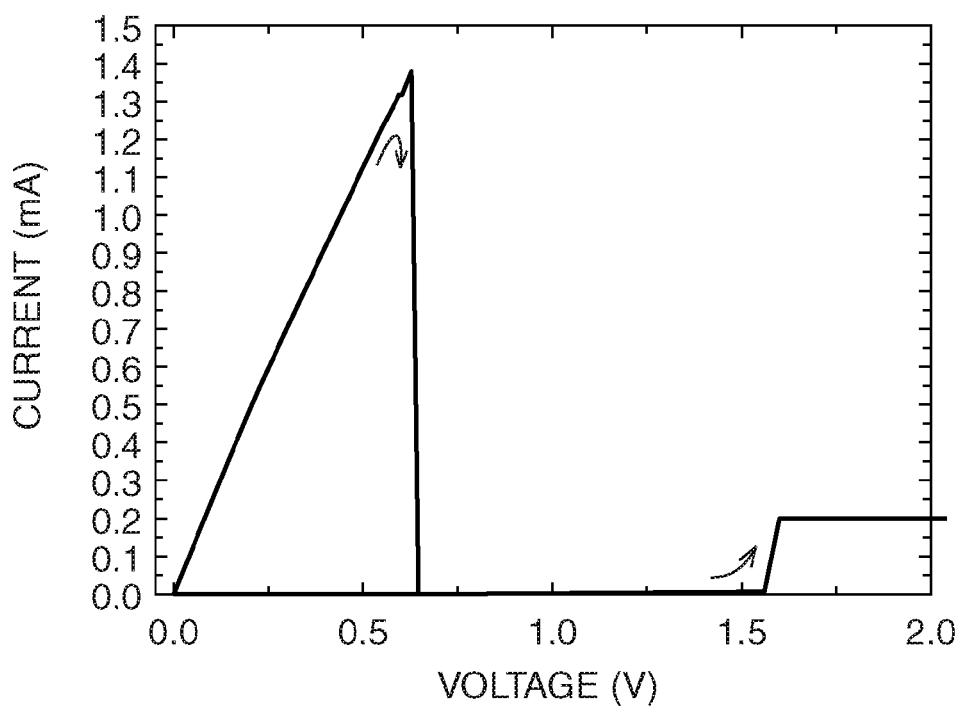
FIG. 10A is a graphic chart illustrating a change of a current in a forming process of a sample C.
Figure 10B:
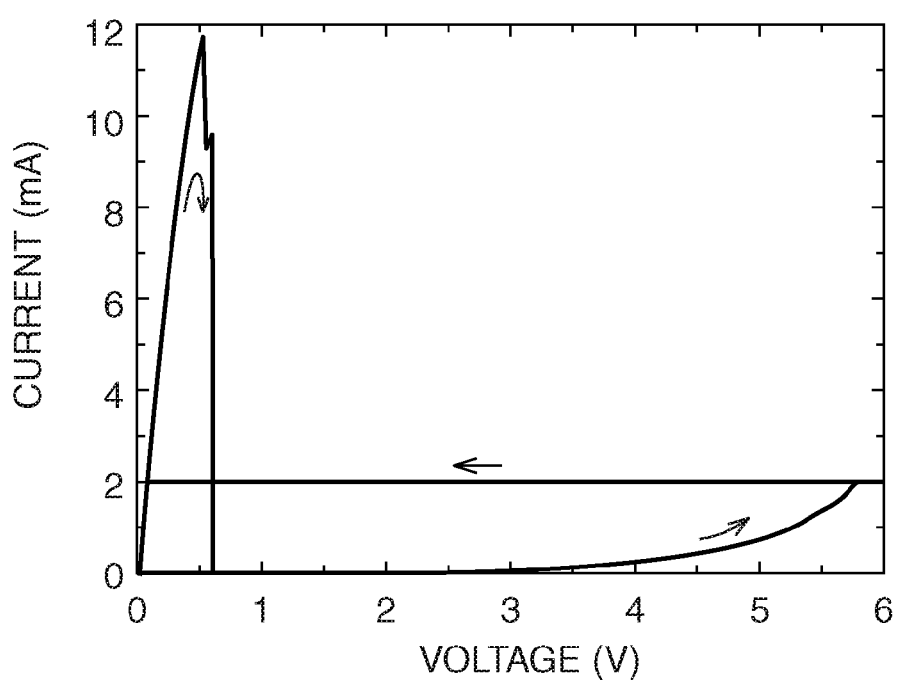
FIG. 10B is a graphic chart illustrating a change of a current in a forming process of a sample D.

As illustrated in FIG. 10A and FIG. 10B, the forming voltage of the sample C was approximately 1.6 V, and this was the same level as a set voltage. However, the forming voltage of the sample D was 5.5 V or more, and this was higher than the set voltage. This is because the higher voltage was required in the sample D for the extent that the thickness of the titanium oxide film was thicker, though it was necessary to form leak spots at the titanium oxide film in either sample.

Figure 10C:
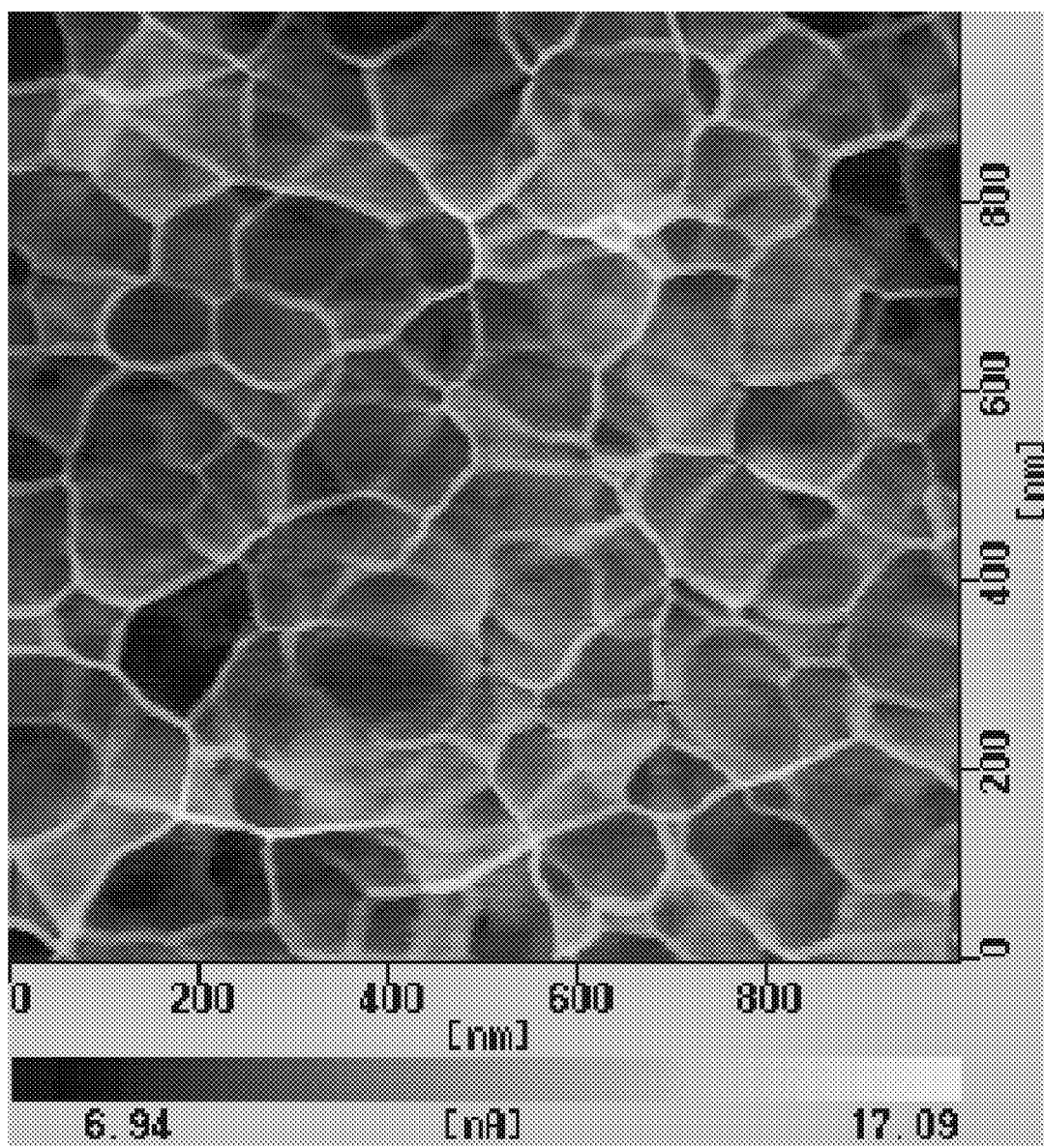
FIG. 10C is a view illustrating a CAFM image of the sample C.

Besides, a CAFM image of the sample C is illustrated in FIG. 10C. As illustrated in FIG. 9B and FIG. 10C, the low-resistance region also spread in the sample C of which thickness of the titanium oxide film was as thin as 5 nm, as it was by no means inferior to the sample B. Accordingly, it is preferable that the thickness of the metal-containing film such as the titanium oxide film is less than 10 nm, particularly to be 8 nm or less.

THIRD EXPERIMENT

In the third experiment, two kinds of samples (sample E and sample F) were manufactured, and checks of operations thereof were performed. In the manufacture of the sample E, first, a titanium film (thickness: 2 nm) was formed on a Pt substrate by a sputtering method. Next, a nickel oxide film (thickness: 5 nm) was formed on the titanium film by a reactive sputtering method. Further, a Pt film was formed on the nickel oxide film. In the manufacture of the sample F, a nickel oxide film (thickness: 5 nm) was formed on a Pt substrate by a reactive sputtering method, and a Pt film was formed thereon. The Pt substrate was set to be a bottom electrode, the Pt film was set to be a top electrode, and the check of a change of a resistance between the bottom electrode and the top electrode was performed by applying a voltage therebetween. A checked result of the sample E is illustrated in FIG. 11A, and a checked result of the sample F is illustrated in FIG. 11B.

Figure 11A:
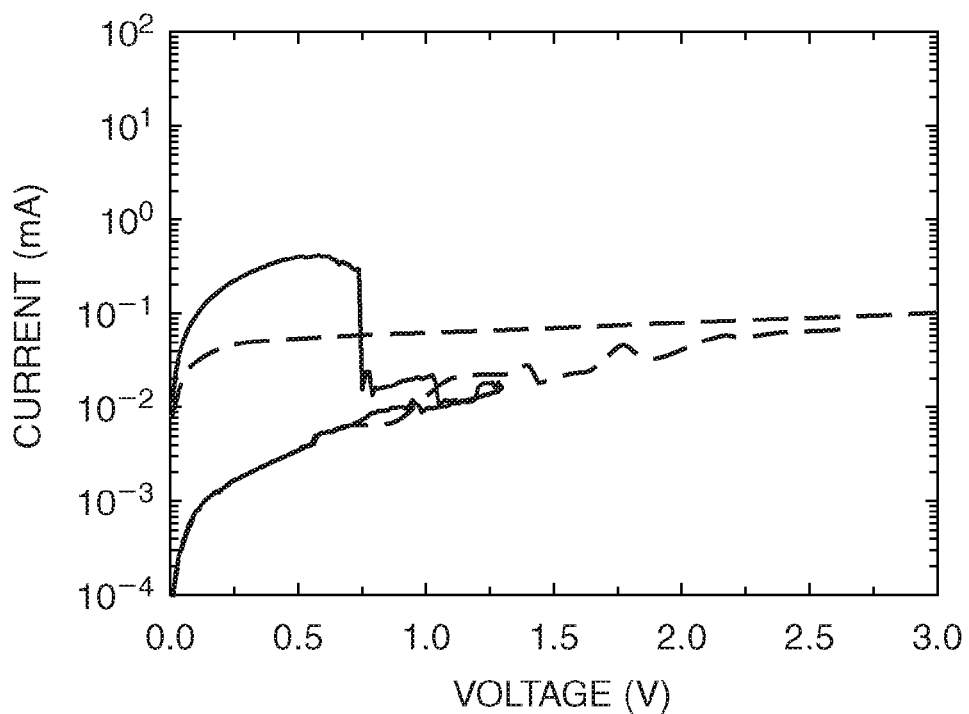
FIG. 11A is a graphic chart illustrating a change of a resistance in a sample E.
Figure 11B:
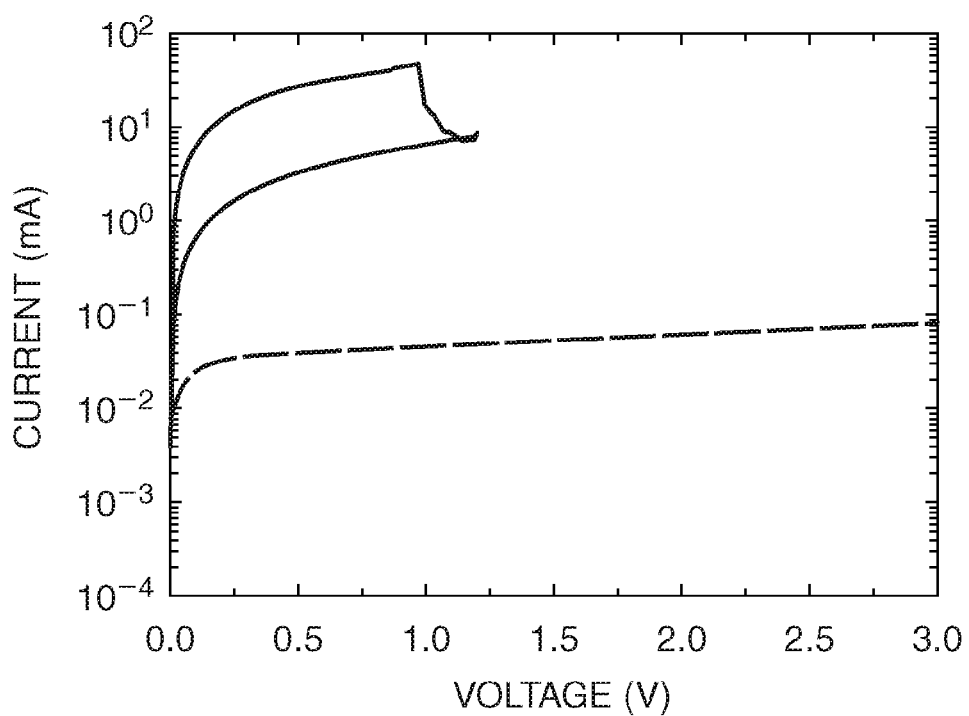
FIG. 11B is a graphic chart illustrating a change of a resistance in a sample F.
Figure 12:
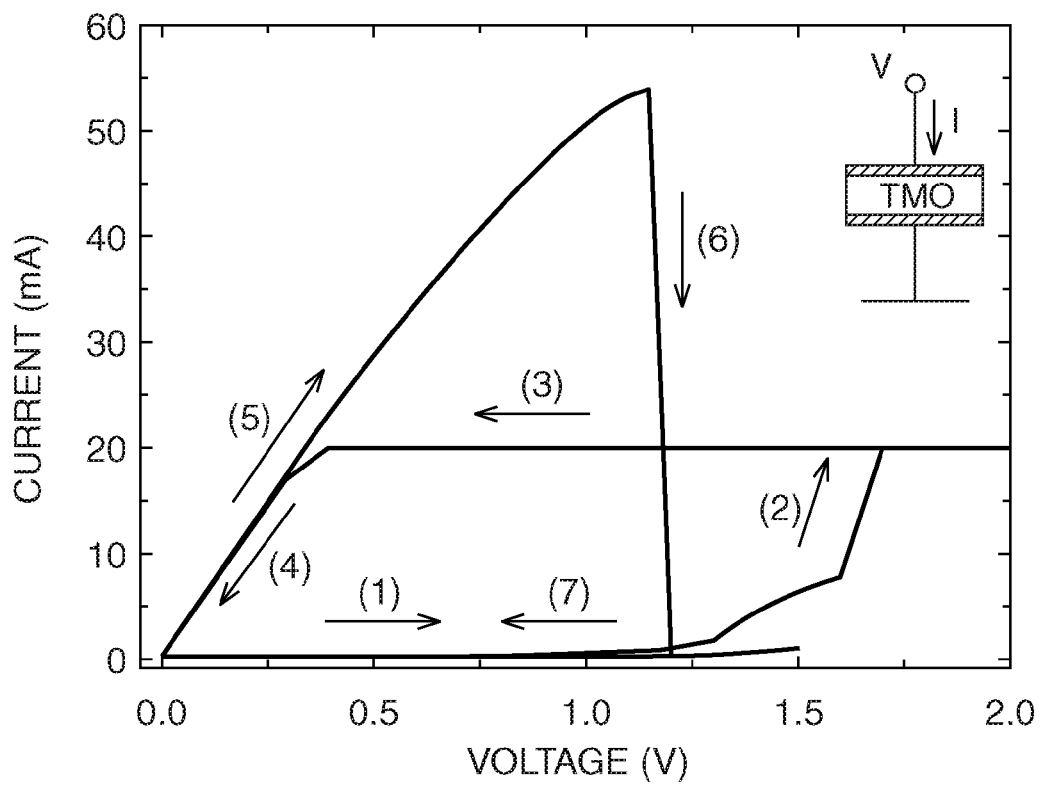
FIG. 12 is a graphic chart illustrating a current-voltage characteristic of a thin film of $TiO_x$ being a unipolar material.
Figure 13A:
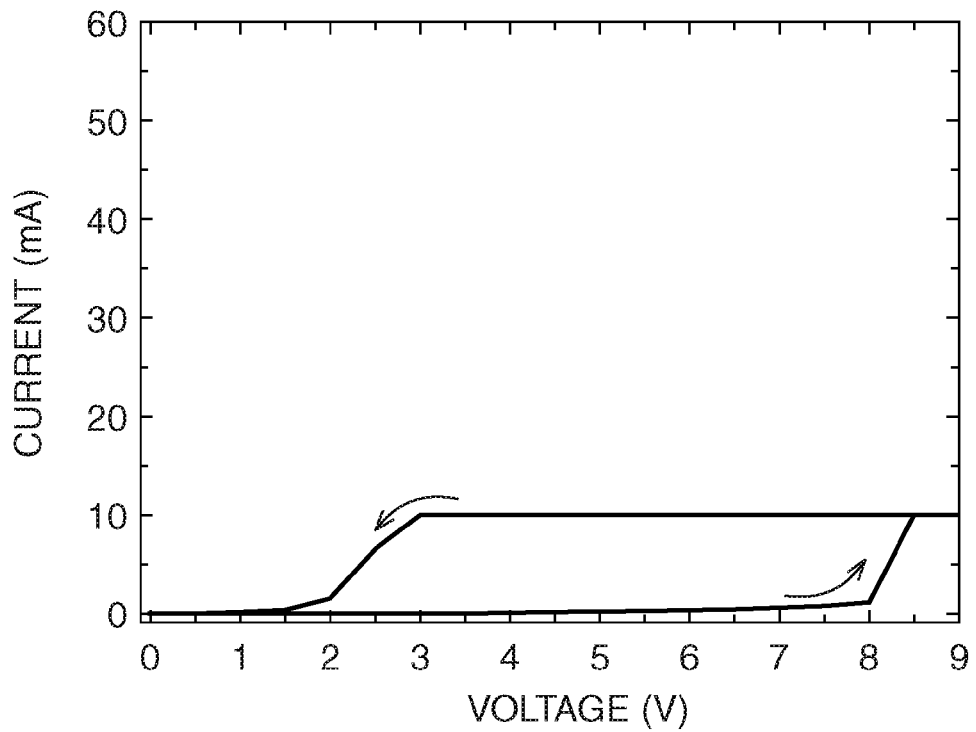
FIG. 13A is a graphic chart illustrating a change of a current in the forming process.
Figure 13B:
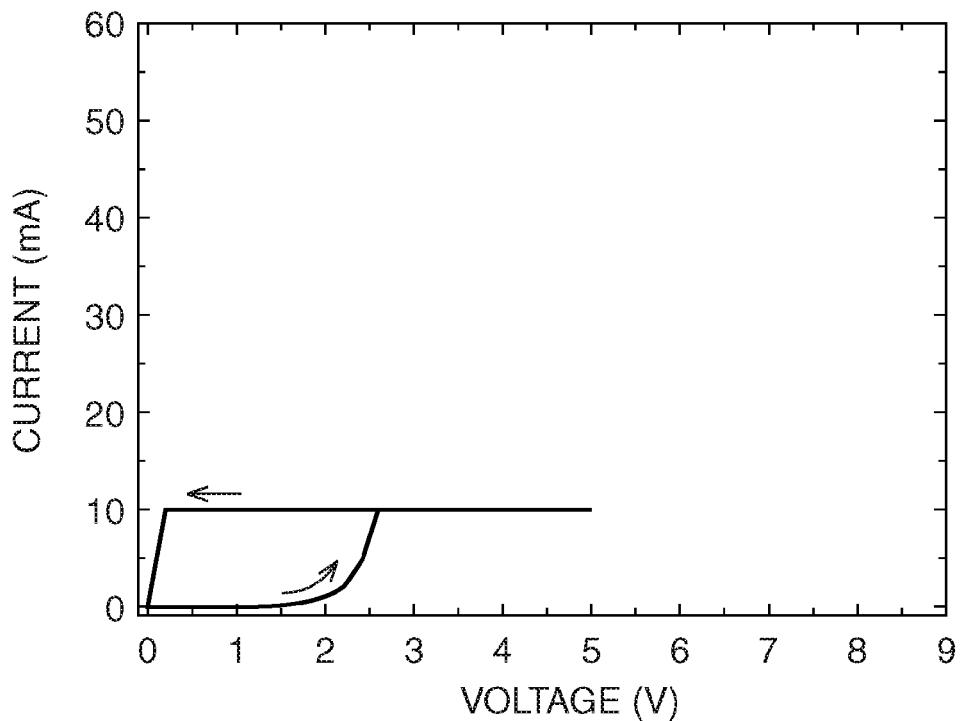
FIG. 13B is a graphic chart illustrating a change of a current in a set process.
Figure 13C:
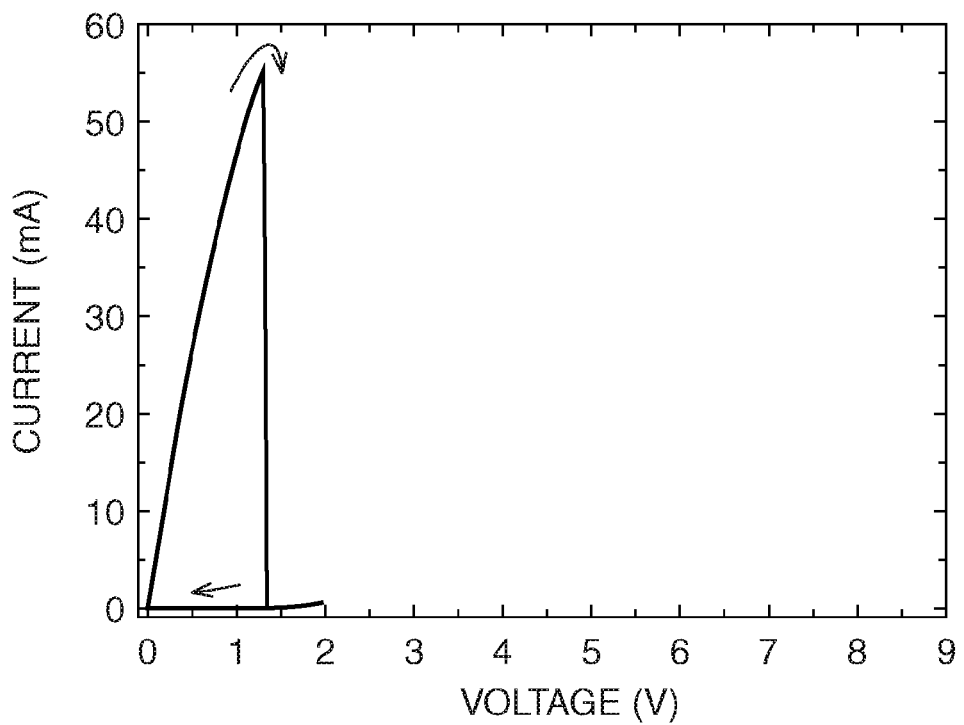
FIG. 13C is a graphic chart illustrating a change of a current in a reset process.

As illustrated in FIG. 11A, the change of the resistance appeared in the sample E, but the change of the resistance did not appear in the sample F. Accordingly, it is possible to use the sample E for the resistance change memory, but it is impossible to use the sample F for the resistance change memory.

According to the embodiments, a metal-containing film composed of a substance which is easier to bond with oxygen than a substance composing a resistance change film is provided between a first electrode and the resistance change film, and therefore, a degree of oxidation of the resistance change film is adjusted appropriately, and a forming voltage can be lowered appropriately.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments(s) of the present invention has(have) been described in detail, it should be understood that the various changes, substitutions, and alterations could be made hereto without departing from the spirit and scope of the invention.

What is claimed is:

1. A semiconductor device, comprising:
   a first electrode;
   a metal-containing film formed on the first electrode and containing metallic atoms;
   a resistance change film formed on the metal-containing film and containing metal oxide; and
   a second electrode formed on the resistance change film, wherein
   the metal-containing film is composed of a substance which is easier to bond with oxygen than a substance composing the resistance change film,
   a resistance of the resistance change film changes in accordance with a voltage applied between the first electrode and the second electrode, and
   the resistance change film is composed of at least one kind of substance selected from a group consisting of titanium oxide, nickel oxide, yttrium oxide, cerium oxide, magnesium oxide, zinc oxide, zirconium oxide, tungsten oxide, niobium oxide, tantalum oxide, chromium oxide, manganese oxide, aluminum oxide, vanadium oxide and silicon oxide.

2. The semiconductor device according to claim 1, wherein the resistance change film has plural resistance values corresponding to the voltages applied between the first electrode and the second electrode.

3. The semiconductor device according to claim 1, wherein the metal-containing film is composed of a substance in which a crystal grain diameter of the resistance change film becomes smaller when the resistance change film is formed on the metal-containing film than a case when the resistance change film is formed on the first electrode.

4. The semiconductor device according to claim 1, wherein the metal-containing film is composed of at least one kind of substance selected from a group consisting of titanium oxide, nickel oxide, yttrium oxide, cerium oxide, magnesium oxide, zinc oxide, zirconium oxide, tungsten oxide, niobium oxide, tantalum oxide, chromium oxide, manganese oxide, aluminum oxide, vanadium oxide and silicon oxide.

5. The semiconductor device according to claim 1, wherein a composition of the metal oxide is short of oxygen than a stoichiometric composition.

6. The semiconductor device according to claim 1, wherein a thickness of the metal-containing film is 8 nm or less.

7. The semiconductor device according to claim 1, wherein the metal-containing film is composed of metal or metal oxide.

8. A manufacturing method of a semiconductor device, comprising:
   forming a metal-containing film containing metallic atoms on a first electrode;
   forming a resistance change film containing metal oxide on the metal-containing film; and
   forming a second electrode on the resistance change film, wherein
   a film composed of a substance easier to bond with oxygen than a substance composing the resistance change film is formed as the metal-containing film,
   a film of which resistance changes in accordance with a voltage applied between the first electrode and the second electrode is formed as the resistance change film, and
   a film composed of at least one kind of substance selected from a group consisting of titanium oxide, nickel oxide, yttrium oxide, cerium oxide, magnesium oxide, zinc oxide, zirconium oxide, tungsten oxide, niobium oxide, tantalum oxide, chromium oxide, manganese oxide, aluminum oxide, vanadium oxide and silicon oxide is formed as the resistance change film.

9. The manufacturing method of a semiconductor device according to claim 8, wherein
   a film having plural resistance values corresponding to the voltages applied between the first electrode and the second electrode is formed as the resistance change film.

10. The manufacturing method of a semiconductor device according to claim 8, wherein a film composed of a substance in which a crystal grain diameter of the resistance change film becomes smaller when the resistance change film is formed on the metal-containing film than a case when the resistance change film is formed on the first electrode is formed as the metal-containing film.

11. The manufacturing method of a semiconductor device according to claim 8, wherein a film composed of at least one kind of substance selected from a group consisting of titanium oxide, nickel oxide, yttrium oxide, cerium oxide, magnesium oxide, zinc oxide, zirconium oxide, tungsten oxide, niobium oxide, tantalum oxide, chromium oxide, manganese oxide, aluminum oxide, vanadium oxide and silicon oxide is formed as the metal-containing film.

12. The manufacturing method of a semiconductor device according to claim 8, wherein, in the forming the metal-containing film, a first metal layer is formed on the first electrode, and thereafter, a metal oxide layer of which composition is short of oxygen than a stoichiometric composition is formed as the metal-containing film by oxidizing the first metal layer.

13. The manufacturing method of a semiconductor device according to claim 12, wherein, in the forming the resistance change film, a second metal layer is formed on the metal-containing film, and thereafter, a metal oxide layer of which composition is short of oxygen than a stoichiometric composition is formed as the resistance change film by oxidizing the second metal layer.

14. The manufacturing method of a semiconductor device according to claim 8, wherein, in the forming the resistance change film, a metal oxide layer of which composition is short of oxygen than a stoichiometric composition is formed on the metal-containing film by a reactive sputtering method as the resistance change film.

15. The manufacturing method of a semiconductor device according to claim 8, wherein a film of which composition of the metal oxide is short of oxygen than a stoichiometric composition is formed as the resistance change film.

16. The manufacturing method of a semiconductor device according to claim 8, wherein a thickness of the metal-containing film is set to be 8 nm or less.

17. The manufacturing method of a semiconductor device according to claim 8, wherein a film composed of metal or metal oxide is formed as the metal-containing film.

* * * * *